(12) United States Patent
Kato et al.

(10) Patent No.: US 9,443,990 B2
(45) Date of Patent: Sep. 13, 2016

(54) SEMICONDUCTOR DEVICE AND METHOD FOR MANUFACTURING SEMICONDUCTOR DEVICE FOR ADJUSTING THRESHOLD THEREOF

(71) Applicant: Semiconductor Energy Laboratory Co., Ltd., Atsugi-shi, Kanagawa-ken (JP)

(72) Inventors: Kiyoshi Kato, Atsugi (JP); Yasuhiko Takemura, Isehara (JP); Tetsuhiro Tanaka, Atsugi (JP); Takayuki Inoue, Sagamihara (JP); Toshihiko Takeuchi, Atsugi (JP); Yasumasa Yamane, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 27 days.

(21) Appl. No.: 14/464,966

(22) Filed: Aug. 21, 2014

(65) Prior Publication Data
US 2015/0054548 A1 Feb. 26, 2015

(30) Foreign Application Priority Data
Aug. 26, 2013 (JP) .................................. 2013-174405

(51) Int. Cl.
*H03K 19/003* (2006.01)
*H01L 21/324* (2006.01)
(Continued)

(52) U.S. Cl.
CPC ......... *H01L 29/792* (2013.01); *G11C 16/0466* (2013.01); *H01L 21/28282* (2013.01); *H01L 27/1225* (2013.01); *H01L 29/4234* (2013.01); *H01L 29/66833* (2013.01); *H03K 19/0013* (2013.01); *H03K 19/17736* (2013.01)

(58) Field of Classification Search
USPC .............. 326/52, 54–55, 101–103, 105, 106
See application file for complete search history.

(56) References Cited

U.S. PATENT DOCUMENTS

| 5,576,637 A * | 11/1996 | Akaogi | G05F 3/205 326/54 |
|---|---|---|---|
| 5,949,732 A * | 9/1999 | Kirihata | G11C 7/18 365/230.03 |

(Continued)

FOREIGN PATENT DOCUMENTS

| JP | 2006-165528 | 6/2006 |
|---|---|---|
| JP | 2011-124360 | 6/2011 |

(Continued)

*Primary Examiner* — Douglas W Owens
*Assistant Examiner* — James H Cho
(74) *Attorney, Agent, or Firm* — Robinson Intellectual Property Law Office; Eric J. Robinson

(57) ABSTRACT

A manufacturing method of a semiconductor device in which the threshold is adjusted is provided. In a semiconductor device including a plurality of transistors arranged in a matrix each including a semiconductor, a source or drain electrode electrically connected to the semiconductor, a gate electrode, and a charge trap layer between the gate electrode and the semiconductor, electrons are trapped in the charge trap layer by performing heat treatment and, simultaneously, keeping a potential of the gate electrode higher than that of the source or drain electrode for 1 second or more. By this process, the threshold increases and Icut decreases. A circuit that supplies a signal to the gate electrode (e.g., word line driver) is provided with a selection circuit formed of an OR gate, an XOR gate, or the like, whereby potentials of word lines can be simultaneously set higher than potentials of bit lines.

16 Claims, 21 Drawing Sheets

(51) Int. Cl.
 *H01L 29/792* (2006.01)
 *H01L 21/28* (2006.01)
 *H01L 29/423* (2006.01)
 *H01L 29/66* (2006.01)
 *G11C 16/04* (2006.01)
 *H01L 27/12* (2006.01)
 *H03K 19/00* (2006.01)
 *H03K 19/177* (2006.01)

(56) References Cited

U.S. PATENT DOCUMENTS

| | | | |
|---|---|---|---|
| 7,692,223 B2 | 4/2010 | Isobe et al. | |
| 7,791,072 B2 | 9/2010 | Kumomi et al. | |
| 7,800,948 B2 * | 9/2010 | Ueda | G11C 16/0491 365/185.14 |
| 8,237,166 B2 | 8/2012 | Kumomi et al. | |
| 8,378,351 B2 | 2/2013 | Fukumoto et al. | |
| 8,384,080 B2 | 2/2013 | Taniguchi et al. | |
| 8,389,991 B2 | 3/2013 | Morosawa et al. | |
| 8,531,618 B2 * | 9/2013 | Koyama | G02F 1/1368 345/87 |
| 8,547,771 B2 | 10/2013 | Koyama | |
| 8,692,252 B2 | 4/2014 | Takata et al. | |
| 2010/0172183 A1 * | 7/2010 | Lue | G11C 16/0466 365/185.18 |
| 2011/0309876 A1 | 12/2011 | Terai et al. | |
| 2012/0056175 A1 | 3/2012 | Takemura | |
| 2013/0122672 A1 * | 5/2013 | Or-Bach | H01L 29/78696 438/199 |
| 2014/0097867 A1 | 4/2014 | Koyama | |
| 2015/0008428 A1 | 1/2015 | Yamamoto et al. | |
| 2015/0011046 A1 | 1/2015 | Tanaka et al. | |
| 2015/0011048 A1 | 1/2015 | Tanaka et al. | |
| 2015/0024577 A1 | 1/2015 | Kato et al. | |
| 2015/0060846 A1 | 3/2015 | Yamamoto et al. | |
| 2015/0069385 A1 | 3/2015 | Yamamoto et al. | |
| 2015/0069387 A1 | 3/2015 | Yamamoto et al. | |

FOREIGN PATENT DOCUMENTS

| | | |
|---|---|---|
| JP | 2011-138934 | 7/2011 |
| JP | 2012-074692 | 4/2012 |
| JP | 2012-257187 | 12/2012 |

* cited by examiner

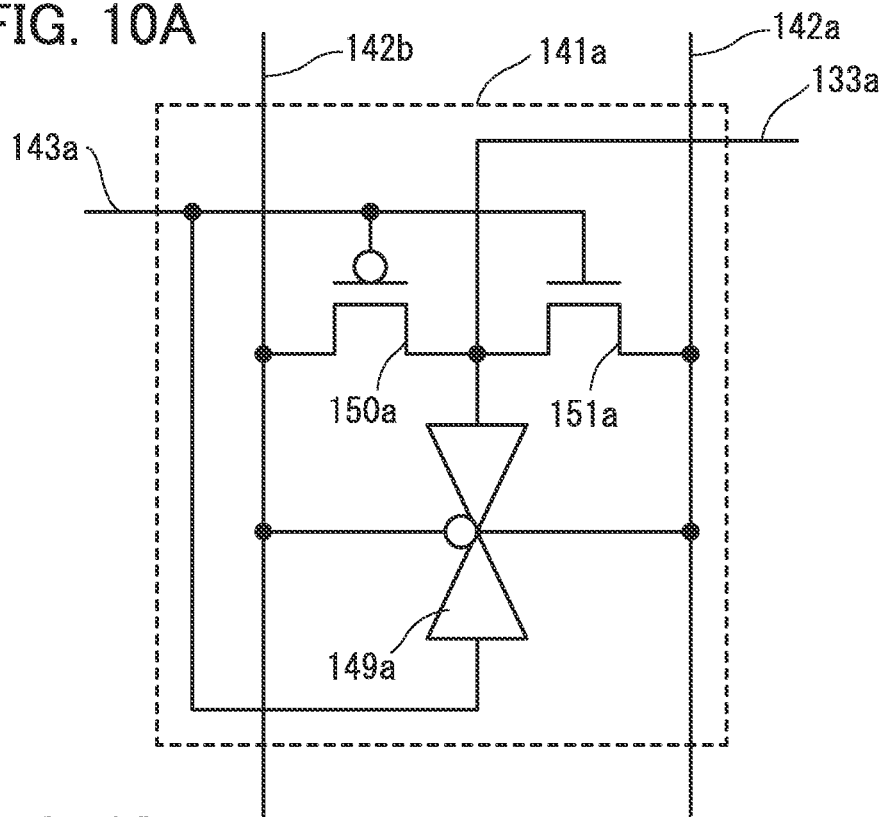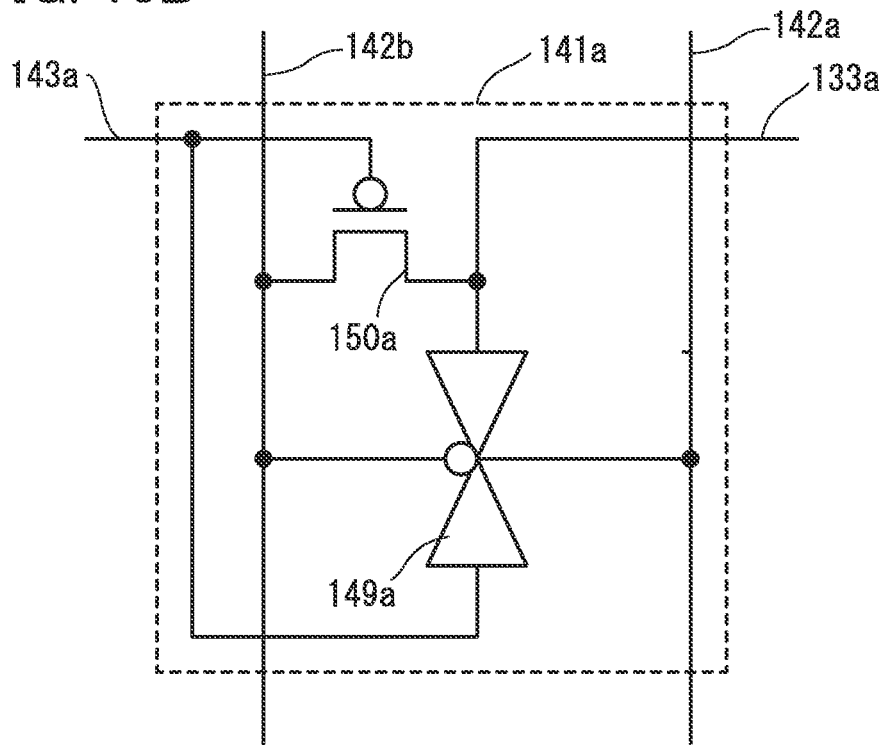

initial charasteristics are measured electron injection measure resin sealing and packaging

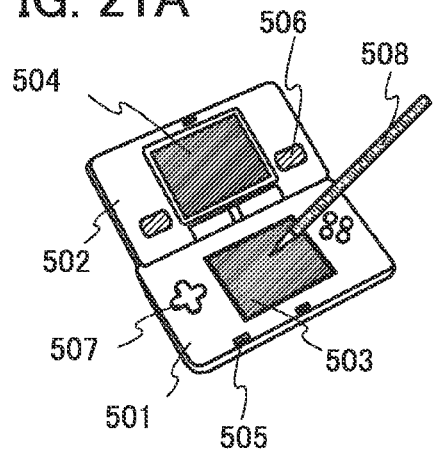
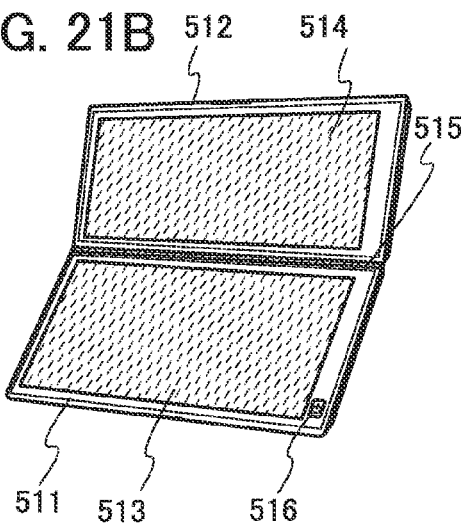
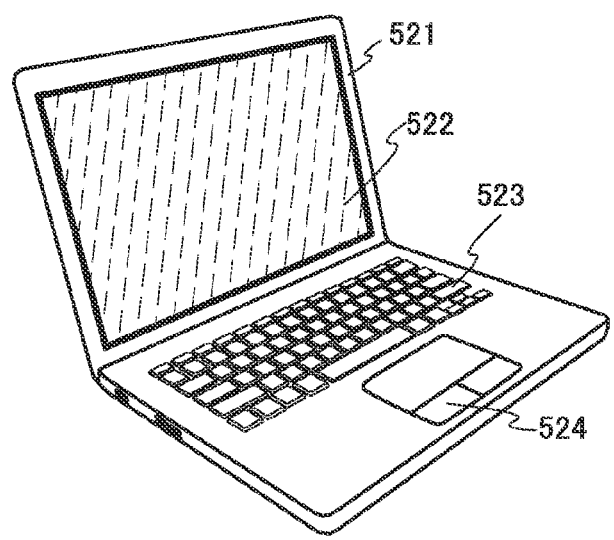
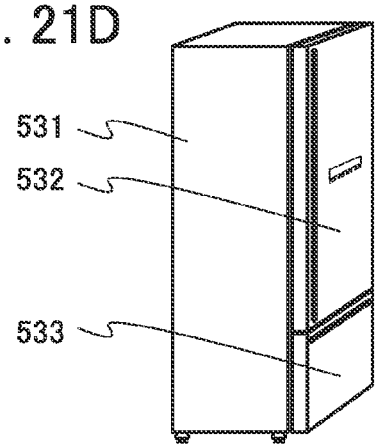
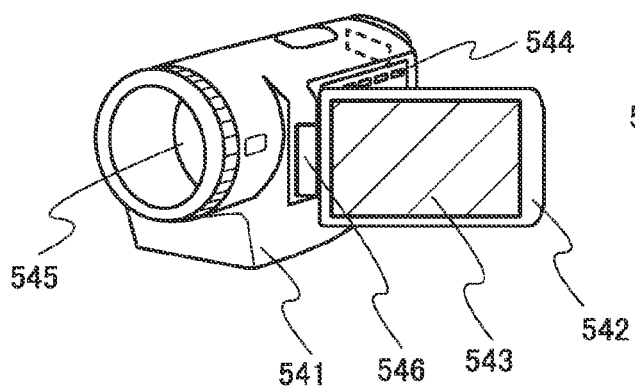
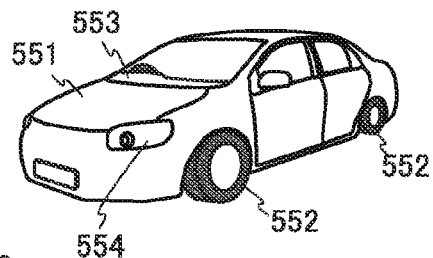

SEMICONDUCTOR DEVICE AND METHOD FOR MANUFACTURING SEMICONDUCTOR DEVICE FOR ADJUSTING THRESHOLD THEREOF

BACKGROUND OF THE INVENTION

1. Field of the Invention

The present invention relates to a semiconductor device and a device including the semiconductor device.

In this specification, a "semiconductor device" refers to a general device that can function by utilizing semiconductor characteristics; an electro-optical device, a semiconductor circuit, and an electronic device can be included in the category of the semiconductor device. A device including a semiconductor device is regarded as a semiconductor device.

2. Description of the Related Art

A transistor is used in a wide range of electronic devices such as an integrated circuit (IC) or an image display device (display device). As materials of the semiconductor that can be used in the transistor, silicon-based semiconductor materials have been widely known, but oxide semiconductors have been attracting attention as alternative materials.

For example, a transistor including an amorphous oxide semiconductor layer containing indium (In), gallium (Ga), and zinc (Zn) is disclosed in Patent Document 1.

Techniques for improving carrier mobility by employing a stacked structure of an oxide semiconductor layer are disclosed in Patent Documents 2 and 3.

It is known that a transistor including an oxide semiconductor layer has an extremely small leakage current when the transistor is off. For example, a low-power-consumption CPU utilizing such a small leakage current characteristic of a transistor including an oxide semiconductor layer is disclosed (see Patent Document 4).

REFERENCE

Patent Document

[Patent Document 1] Japanese Published Patent Application No. 2006-165528
[Patent Document 2] Japanese Published Patent Application No. 2011-124360
[Patent Document 3] Japanese Published Patent Application No. 2011-138934
[Patent Document 4] Japanese Published Patent Application No. 2012-257187
[Patent Document 5] Japanese Published Patent Application No. 2012-074692

SUMMARY OF THE INVENTION

The transistor size decreases in accordance with an increase in the degree of circuit integration. The miniaturization of a transistor may cause deterioration of electrical characteristics, such as on-state current, off-state current, threshold, and an S value (subthreshold swing), of the transistor (see Patent Document 5). In general, shortening the channel length increases the on-state current, but at the same time increases the off-state current, a variation in threshold, and the S value.

An object of one embodiment disclosed in this specification is to provide a method for adjusting (correcting) the threshold of a semiconductor device and a semiconductor device suited for the adjusting method. Another object of one embodiment is to provide a semiconductor device having a structure that can prevent deterioration of electrical characteristics, which becomes more significant with the increasing miniaturization. In addition, another object is to provide a highly integrated semiconductor device. Another object is to provide a semiconductor device in which deterioration of on-state current characteristics is reduced. Another object is to provide a semiconductor device with low power consumption. Another object is to provide a semiconductor device with high reliability. Another object is to provide a semiconductor device which can retain data even when power supply is stopped. Another object is to provide a semiconductor device with favorable characteristics. Another object is to provide a novel semiconductor device.

Note that the descriptions of these objects do not disturb the existence of other objects. In one embodiment disclosed in this specification, there is no need to achieve all the above objects. Other objects will be apparent from and can be derived from the description of the specification, the drawings, the claims, and the like.

One embodiment disclosed in this specification is a semiconductor device including a plurality of transistors which each includes a first semiconductor, an electrode electrically connected to the first semiconductor, a gate electrode, and a charge trap layer between the gate electrode and the first semiconductor; a first circuit configured to supply a signal to the gate electrode of the plurality of transistors; and a second circuit configured to supply a signal to the electrode of the plurality of transistors. In the semiconductor device, the first circuit includes a decoder and a selection circuit. A signal output from the decoder and a first signal are input to the selection circuit. A second signal is output from the selection circuit to the gate electrode. The selection circuit performs an OR operation or an XOR operation.

The above-described structure may include a second semiconductor and a third semiconductor between which the first semiconductor is sandwiched. The second semiconductor may be positioned between the first semiconductor and the charge trap layer.

In the above-described structure, the gate electrode may face a top surface and a side surface of the first semiconductor.

In the above-described structure, the charge trap layer may include any one of silicon nitride, hafnium oxide, aluminum oxide, and aluminum silicate.

At least one of the following effects described in this paragraph or the effects described in other paragraphs can be achieved: the provision of a method for adjusting the threshold of a semiconductor device, the provision of a semiconductor device having a structure that can prevent deterioration of electrical characteristics, which becomes more significant with the increasing miniaturization, the provision of a highly integrated semiconductor device, the provision of a semiconductor device with low power consumption, the provision of a semiconductor device with high reliability, and the provision of a semiconductor device which can retain data even when power supply is stopped.

BRIEF DESCRIPTION OF THE DRAWINGS

In the accompanying drawings:

FIGS. 10A and 10B illustrate examples of a circuit of an embodiment;

FIGS. 21A to 21F illustrate examples of an electronic device;

DETAILED DESCRIPTION OF THE INVENTION

Figure 1A:
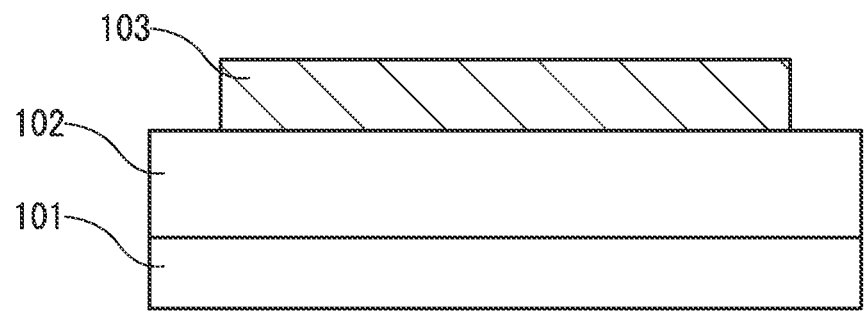
FIGS. 1A to 1D illustrate examples of a semiconductor device of an embodiment.

Embodiments will be described in detail with reference to drawings. The technical idea disclosed in this specification is not limited to the following description and it will be readily appreciated by those skilled in the art that modes and details can be modified in various ways without departing from the spirit and the scope disclosed herein. Therefore, the technical idea disclosed in this specification should not be interpreted as being limited to the description of the embodiments below.

Note that in structures of the present invention described below, the same portions or portions having similar functions are denoted by the same reference numerals in different drawings, and description thereof is not repeated in some cases.

Note that functions of a "source (source electrode)" and a "drain (drain electrode)" of a transistor are sometimes replaced with each other when a transistor of opposite polarity is used or when the direction of current flow is changed in circuit operation, for example. Therefore, the terms "source" and "drain" can be replaced with each other in this specification.

Note that in this specification and the like, ordinal numbers such as "first" and "second" are used in order to avoid confusion among components and do not limit the components numerically.

Embodiment 1

In this embodiment, a structure of a semiconductor device including a semiconductor layer, a charge trap layer, and a gate electrode, the principle of operation of the semiconductor device, and a circuit that uses the semiconductor device will be described. FIG. 1A illustrates a semiconductor device including a semiconductor layer 101, a charge trap layer 102, and a gate electrode 103. The charge trap layer 102 can serve as the gate insulating layer.

Figure 1B:
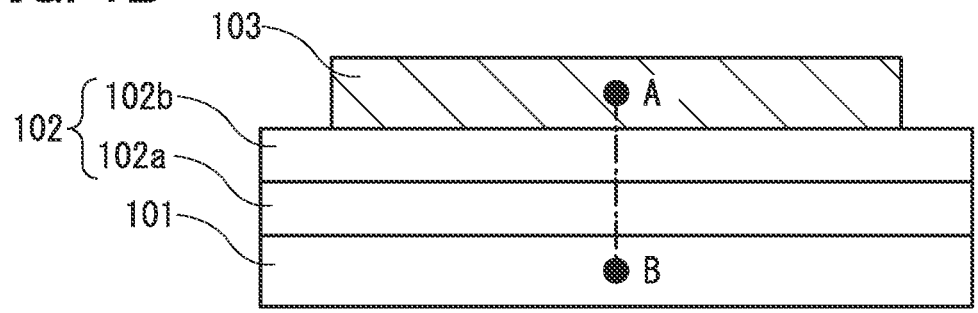
Figure 1C:
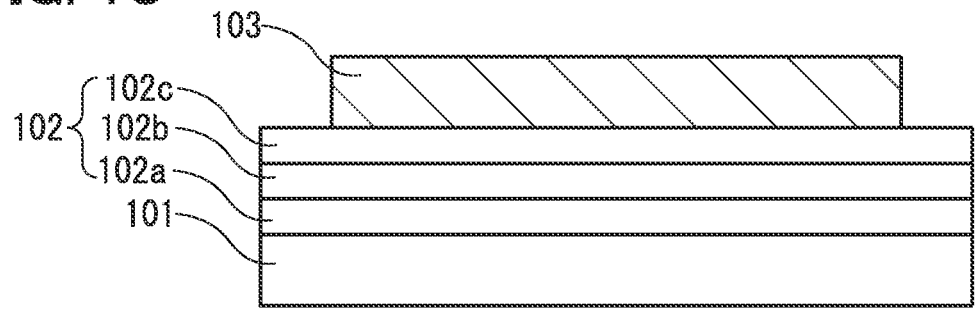
Figure 1D:
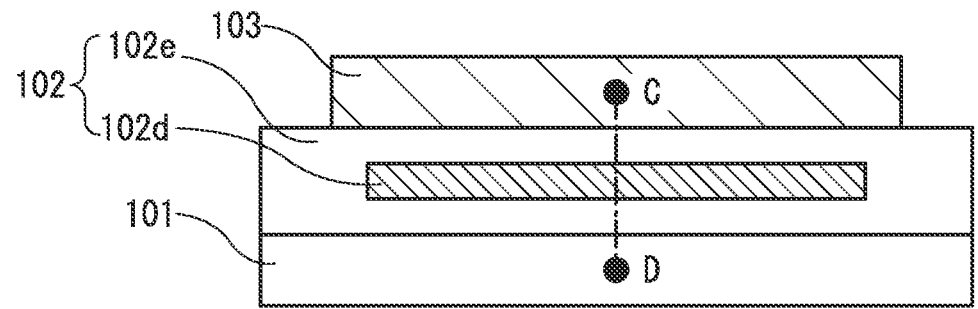

Here, the charge trap layer 102 may be a stacked body that includes a first insulating layer 102a and a second insulating layer 102b as illustrated in FIG. 1B, for example. Alternatively, the charge trap layer 102 may be a stacked body that includes the first insulating layer 102a, the second insulating layer 102b, and a third insulating layer 102c as illustrated in FIG. 1C, or a stacked body including four or more insulating layers. Alternatively, the charge trap layer 102 may include an electrically insulated conductive layer 102d in an insulator 102e as illustrated in FIG. 1D. A plurality of insulating layers may constitute the insulator 102e.

Figure 2A:
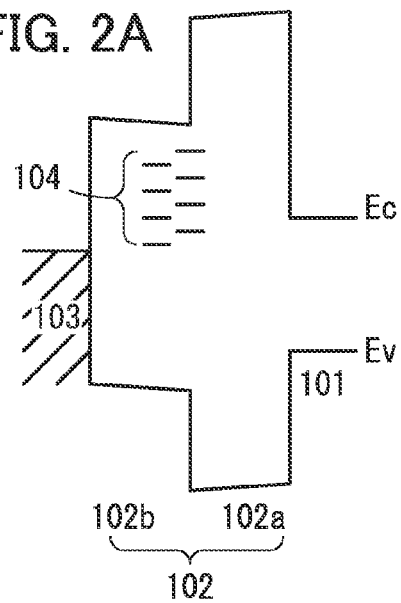
FIGS. 2A to 2D illustrate band diagram examples of a semiconductor device of an embodiment.

FIG. 2A illustrates a band diagram example of the semiconductor device illustrated in FIG. 1B, from point A to point B. In the drawings, Ec represents a conduction band minimum and Ev represents a valence band maximum. In FIG. 2A, the potential of the gate electrode 103 is the same as the potential of a source electrode (not illustrated) or a drain electrode (not illustrated).

In this example, the band gap of the first insulating layer 102a is wider than that of the second insulating layer 102b and the electron affinity of the first insulating layer 102a is lower than that of the second insulating layer 102b; however, the relations of the band gap and the electron affinity are not limited to this example.

Figure 2B:
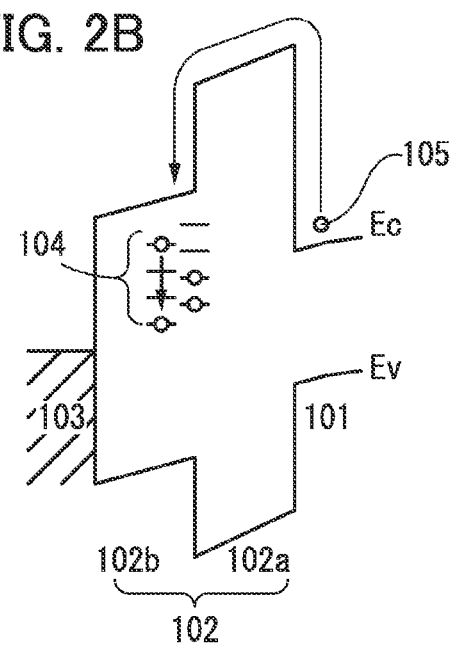

Charge trap states 104 exist at the interface between the first insulating layer 102a and the second insulating layer 102b or inside the second insulating layer 102b. FIG. 2B shows the state where the potential of the gate electrode 103 is higher than the potential of the source or drain electrode. The potential of the gate electrode 103 at this process may be higher than the potential of the source or drain electrode by 1 V or more. The potential of the gate electrode 103 at this process may be lower than the highest potential applied to the gate electrode 103 after this process. The potential at this process may be typically less than 4 V.

Electrons 105 that exist in the semiconductor layer 101 move toward the gate electrode 103 having a higher potential. Some of the electrons 105 moving from the semiconductor layer 101 toward the gate electrode 103 are trapped in the charge trap states 104.

There are some processes to enable the electrons 105 to go over the barrier between the semiconductor layer 101 and the charge trap layer 102 and to be trapped in the charge trap states 104. The first is a process by the tunnel effect. The thinner the first insulating layer 102a is, the more prominent the tunnel effect is. Note that electrons trapped by the charge trap states 104 may return to the semiconductor layer 101 by the tunnel effect.

Even when the charge trap layer 102 is relatively thick, the tunnel effect (Fowler-Nordheim tunnel effect) can be obtained by applying an appropriate voltage to the gate electrode 103. In the case of the Fowler-Nordheim tunnel effect, a tunnel current increases with the square of the electric field between the gate electrode 103 and the semiconductor layer 101.

The second is the process that the electrons 105 hop from trap states to trap states in the band gap such as defect states in the charge trap layer 102 to reach the second insulating layer 102b. This is a conduction mechanism called Poole-Frenkel conduction, in which as the absolute temperature is higher and trap states are shallower, the electric conductivity is higher.

The third is the process that the electrons 105 go over the barrier of the charge trap layer 102 by thermal excitation. The distribution of electrons existing in the semiconductor layer 101 follows the Fermi-Dirac distribution; in general, the proportion of electrons having high energy is larger as the temperature is higher. Assuming that the density of electrons having energy 3 eV higher than the Fermi level at 300 K (27° C.) is 1, for example, the density is $6 \times 10^{16}$ at 450 K (177° C.), $1.5 \times 10^{25}$ at 600 K (327° C.), and $1.6 \times 10^{30}$ at 750 K (477° C.).

The movement of the electrons 105 toward the gate electrode 103 by going over the barrier of the charge trap layer 102 occurs by the above three processes or the combination of these processes. In particular, the second and the third processes indicate that current increases exponentially as the temperature is higher.

Also, the Fowler-Nordheim tunnel effect is more likely to occur as the density of electrons in a thin part (a high-energy portion) of the barrier layer of the charge trap layer 102 is higher; thus, a higher temperature is better.

Note that in most cases, current generated by the conduction mechanism is weak in particular when the difference in potential between the gate electrode 103 and the semiconductor layer 101 is small (4 V or lower). However, by taking a long time for the process (e.g., 1 second or more), a necessary number of electrons can be trapped by the charge trap states 104. As a result, the charge trap layer 102 is negatively charged.

In other words, the potential of the gate electrode 103 is kept higher than that of the source or drain electrode at a high temperature (a temperature higher than the operating temperature or the storage temperature of the semiconductor device, or higher than or equal to 125° C. and lower than or equal to 450° C., typically higher than or equal to 150° C. and lower than or equal to 300° C.) for one second or longer, typically 1 minute or longer. As a result, a necessary number of electrons moves from the semiconductor layer 101 toward the gate electrode 103 and some of them are trapped by the charge trap states 104. The temperature of the process for trapping electrons is referred to as process temperature below.

Here, the number of electrons trapped by the charge trap states 104 can be adjusted by the potential of the gate electrode 103. When a certain number of electrons are trapped by the charge trap states 104, due to the electric charge, the electric field of the gate electrode 103 is blocked and a channel formed in the semiconductor layer 101 disappears.

The total number of electrons trapped by the charge trap states 104 increases linearly at first, and then, the rate of increase gradually decreases and the total number of electrons converges at a certain value. The convergence value depends on the potential of the gate electrode 103. As the potential is higher, the number of trapped electrons tends to be larger, however, it never exceeds the total number of charge trap states 104.

The electrons trapped by the charge trap states 104 are required not to transfer from the charge trap layer 102 to the other regions. For this, the thickness of the charge trap layer 102 is preferably set at a thickness at which the tunnel effect is not a problem. For example, the physical thickness is preferably more than 1 nm.

If the thickness of the charge trap layer 102 is too large as compared with the channel length of the semiconductor device, the subthreshold value is increased to degrade the off-state characteristics. For this reason, the channel length is more than or equal to four times, typically more than or equal to ten times as large as the equivalent silicon oxide thickness (EOT) of the charge trap layer 102. Note that when a so-called High-K material is used, the EOT is less than the physical thickness.

Typically, the physical thickness of the charge trap layer 102 is more than or equal to 10 nm and less than or equal to 100 nm and the EOT of the charge trap layer 102 is more than or equal to 10 nm and less than or equal to 25 nm. In the structures as illustrated in FIG. 1B or 1C, the thickness of the first insulating layer 102a is more than or equal to 10 nm and less than or equal to 20 nm, and the EOT of the second insulating layer 102b is more than or equal to 1 nm and less than or equal to 25 nm.

To hold electrons trapped by the charge trap states 104 inside the second insulating layer 102b or at the interface with another insulating layer, it is effective that the charge trap layer 102 is formed of three insulating layers as illustrated in FIG. 1C, that the electron affinity of the third insulating layer 102c is smaller than that of the second insulating layer 102b, and that the band gap of the third insulating layer 102c is larger than that of the second insulating layer 102b.

In this case, if the physical thickness of the third insulating layer 102c is large enough, electrons trapped by the charge trap states 104 can be held even when the second insulating layer 102b has a small thickness. As a material of the third insulating layer 102c, the same material as or a material similar to that of the first insulating layer 102a can be used. Alternatively, a material whose constituent elements are the same as those of the second insulating layer 102b but number of charge trap states is small enough may be used. The number of charge trap states depends on the formation method. The thickness of the third insulating layer 102c is more than or equal to 1 nm and less than or equal to 20 nm.

Figure 2C:
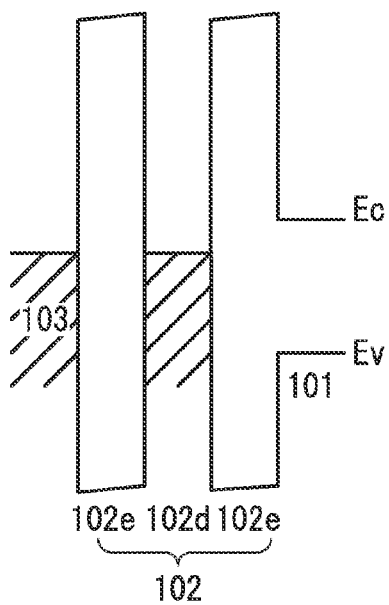
Figure 2D:
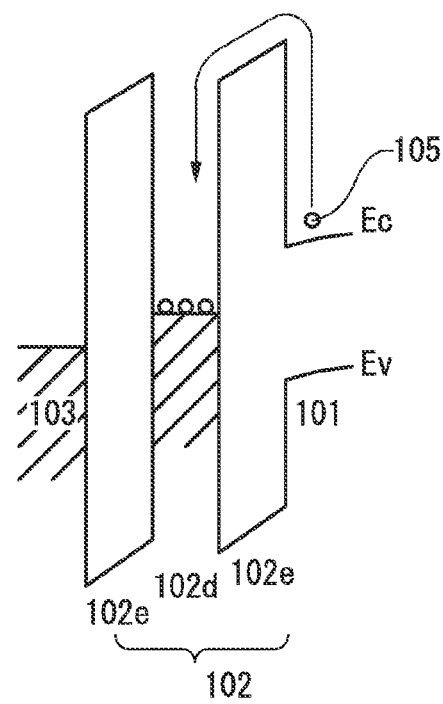

Note that when the electrically insulated conductive layer 102d is surrounded by the insulator 102e as illustrated in FIG. 1D, electrons are trapped in the conductive layer 102d according to the above principle. FIGS. 2C and 2D illustrate examples of such a case. FIG. 2C is a band diagram example, from point C to point D in FIG. 1D. In FIG. 2C, the potential of the gate electrode 103 is equal to that of the source or drain electrode.

FIG. 2D shows the state where the potential of the gate electrode 103 is higher than the potential of the source or drain electrode. Electrons 105 that exist in the semiconductor layer 101 move toward the gate electrode 103 having a higher potential. Some of the electrons 105 moving from the semiconductor layer 101 toward the gate electrode 103 are trapped in the conductive layer 102d. In other word, in the semiconductor device illustrated in FIG. 1D, the conductive layer 102d functions as the charge trap states 104 in the semiconductor device in FIG. 1B.

Note that when the work function of the conductive layer 102d is large, an energy barrier to the insulator 102e is high and consequently the trapped electrons can be prevented from moving out from the conductive layer 102d.

In the above structure, the conductive layer 102d may be formed of a plurality of conductive layers. In addition, the first insulating layer 102a, the second insulating layer 102b, the third insulating layer 102c, and the insulator 102e may each be formed of a plurality of insulating layers. A plurality of insulating layers containing the same constituting elements and formed by different formation methods may be used.

When the first and second insulating layers 102a and 102b are formed using insulating layers formed of the same constituting elements (e.g., hafnium oxide), the first insulating layer 102a may be formed by a CVD method or an ALD method and the second insulating layer 102b may be formed by a sputtering method.

In general, an insulating layer formed by a sputtering method includes more charge trap states 104 than an insulating layer formed by a CVD method or an ALD method, and thus has stronger electron trapping characteristics. From this reason, the second insulating layer 102b may be formed by a sputtering method and the third insulating layer 102c may be formed by a CVD method or an ALD method when the second and third insulating layers 102b and 102c contain the same constituent elements.

When the second insulating layer 102b is formed using a plurality of insulating layers containing the same constituent elements, one insulating layer may be formed by a sputtering method and another insulating layer may be formed by a CVD method or an ALD method.

The second method for preventing electrons trapped by the charge trap states 104 from transferring from the charge trap layer 102 to the other regions is to set the operating temperature or the storage temperature of the semiconductor device at a temperature that is lower enough than the process temperature. The probability that electrons go over a 3 eV-barrier when the temperature is 120° C. is less than a one hundred-thousandth that when the temperature is 300° C. In this way, although electrons easily go over a barrier to be trapped by the charge trap states 106 during the process at 300° C., the electrons are difficult to go over the barrier during storage at 120° C. and are kept trapped by the charge trap states 106 for a long time.

It is also effective that the effective mass of a hole is extremely large or is substantially localized in the semiconductor layer 101. In this case, the injection of holes from the semiconductor layer 101 to the charge trap layer 102 does not occur and consequently a phenomenon in which electrons trapped by the charge trap states 104 bond to holes and disappear does not occur.

Circuit design or material selection may be made so that no voltage at which electrons trapped in the charge trap layer 102 are released is applied. For example, in a material whose effective mass of holes is extremely large or is substantially localized, such as an In—Ga—Zn-based oxide semiconductor, a channel is formed when the potential of the gate electrode 103 is higher than that of the source or drain electrode; however, when the potential of the gate electrode 103 is lower than that of the source or drain electrode, the material shows characteristics similar to an insulator. In this case, the electric field between the gate electrode 103 and the semiconductor layer 101 is extremely small and consequently the Fowler-Nordheim tunnel effect or electron conduction according to the Poole-Frenkel conduction is significantly decreased.

The second insulating layer 102b is formed using a material (or a formation method or formation conditions) that makes the number of charge trap states 104 larger. Accordingly, many charge trap states 104 are formed at the interface between the first insulating layer 102a and the second insulating layer 102b and at the interface between the second insulating layer 102b and the third insulating layer 102c.

By setting the potential of the gate electrode 103 and the temperature at the above-described conditions, electrons from the semiconductor layer 101 are trapped by the charge trap states 104 as described with FIG. 2B, so that the charge trap layer 102 is negatively charged.

The threshold of a semiconductor device is increased by the trap of electrons in the charge trap layer 102. In particular, when the semiconductor layer 101 is formed using a wide band gap material, a source-drain current (cut-off current, Icut) when the potential of the gate electrode 103 is equal to the potential of the source electrode can be significantly decreased.

For example, the current density of Icut (a current value per micrometer of a channel width) of an In—Ga—Zn-based oxide whose band gap is 3.2 eV is 1 zA/μm ($1\times10^{-21}$ A/μm) or less, typically 1 yA/μm ($1\times10^{-24}$ A/μm) or less.

Figure 3A:
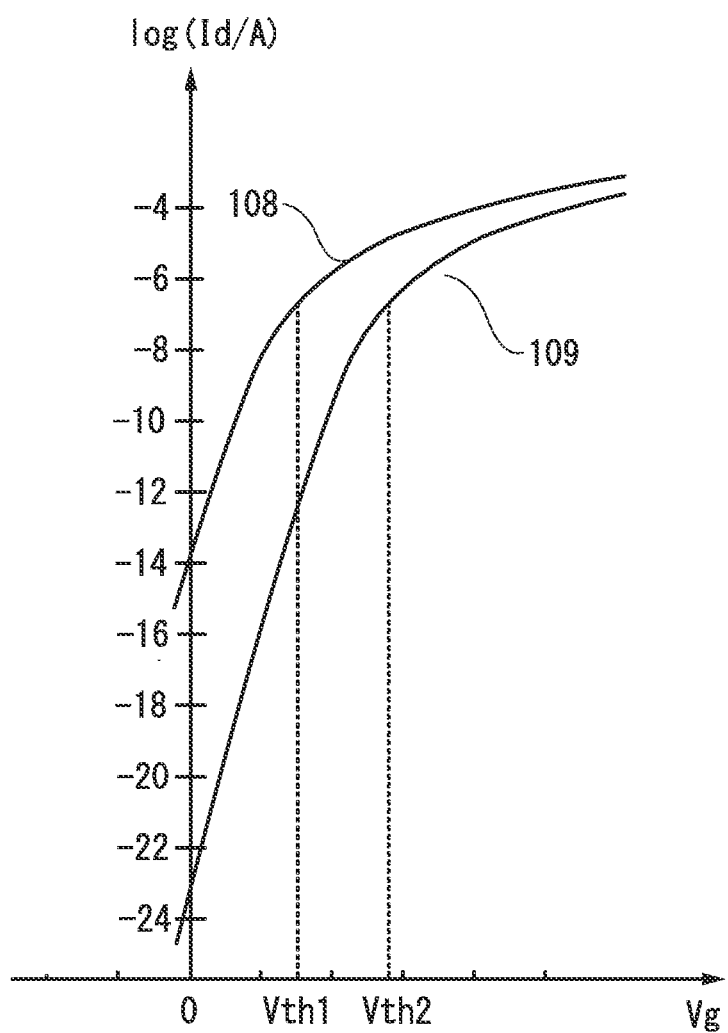
FIG. 3A schematically shows characteristics of a semiconductor device of an embodiment and FIG. 3B illustrates an example of a circuit in which the semiconductor device is used.

FIG. 3A schematically shows dependence of current per micrometer of channel width (Id) between source and drain electrodes on the potential of the gate electrode 103 (Vg) at room temperature, before and after electron trap in the charge trap layer 102. The potential of the source electrode is 0 V and the potential of the drain electrode is +1 V. Although current smaller than 1 fA cannot be measured directly, it can be estimated from a value measured by another method, the subthreshold value, and the like.

As indicated by a curve 108, the threshold of the semiconductor device is Vth1 at first. After electron trapping, the threshold increases (shifts in the positive direction) to become Vth2. As a result, the current density when Vg=0 becomes 1 aA/μm ($1\times10^{-18}$ A/μm) or less, for example, greater than or equal to 1 zA/μm and less than or equal to 1 yA/μm.

Figure 3B:
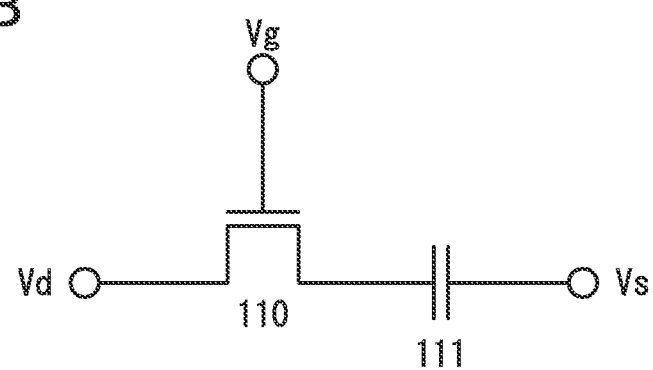

FIG. 3B illustrates a circuit in which charge stored in a capacitor 111 is controlled by a transistor 110. Leakage current between electrodes of the capacitor 111 is ignored here. The capacitance of the capacitor 111 is 1 fF, the potential of the capacitor 111 on the transistor 110 side is +1 V, and the potential of Vd is 0 V.

The curve 108 in FIG. 3A denotes the Id-Vg characteristics of the transistor 110. When the channel width is 0.1 μm, the Icut is approximately 1 fA and the resistivity of the transistor 110 at this time is approximately $1\times10^{15}\Omega$. Accordingly, the time constant of a circuit composed of the transistor 110 and the capacitor 111 is approximately one second. This means that most of the charge stored in the capacitor 111 is lost in approximately one second.

The curve 109 in FIG. 3A denotes the Id-Vg characteristics of the transistor 110. When the channel width is 0.1 μm, the Icut is approximately 1 yA and the resistivity of the transistor 110 at this time is approximately $1\times10^{24}\Omega$. Accordingly, the time constant of the circuit composed of the transistor 110 and the capacitor 111 is approximately $1\times10^9$ seconds (=approximately 31 years). This means that one-third of the charge stored in the capacitor 111 is left after 10 years.

From this, charge can be held for 10 years in a simple circuit composed of a transistor and a capacitor without applying such a large voltage. This can be applied to various kinds of memory devices, such as memory cells illustrated in FIGS. 4A and 4B.

Figure 4A:
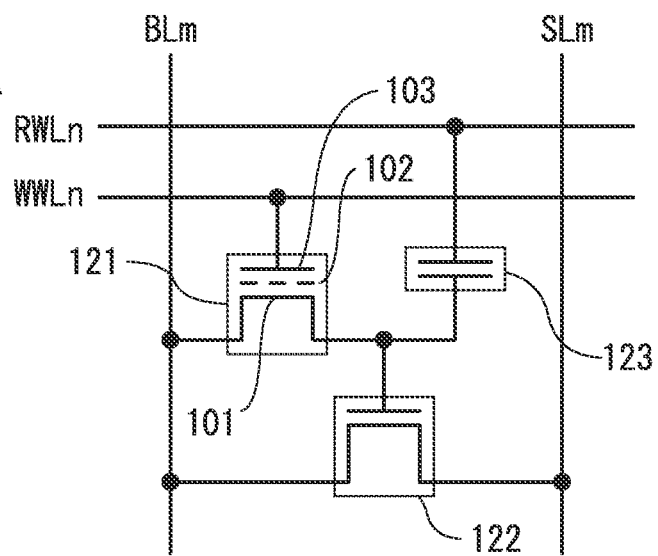
FIGS. 4A and 4B illustrate examples of a memory cell of an embodiment.

The memory cell illustrated in FIG. 4A includes a transistor 121, a transistor 122, and a capacitor 123. The transistor 121 includes the charge trap layer 102 as illustrated in FIG. 1A. After the circuit is formed, the above-described process for increasing the threshold (also referred to as "threshold adjustment process") is performed to lower Icut. Note that in the drawing, the transistor having the adjusted threshold because of including electrons in the charge trap layer 102 is represented by a symbol that is different from the symbol for a normal transistor.

Memory cells in FIG. 4A are formed in a matrix. For example, to the memory cell in the n-th row and m-th column, a read word line RWLn, a write word line WWLn, a bit line BLm, and a source line SLm are connected.

The threshold correction can be performed as follows. First, potentials of all read word lines, all source lines and all bit lines are set at 0 V. Then, a wafer or chip over which the memory cells are formed is set at an appropriate temperature and the potentials of all the write word lines are set at an appropriate value (e.g., +3 V), and these conditions are held for an appropriate period. In this way, the threshold becomes an appropriate value.

Figure 4B:
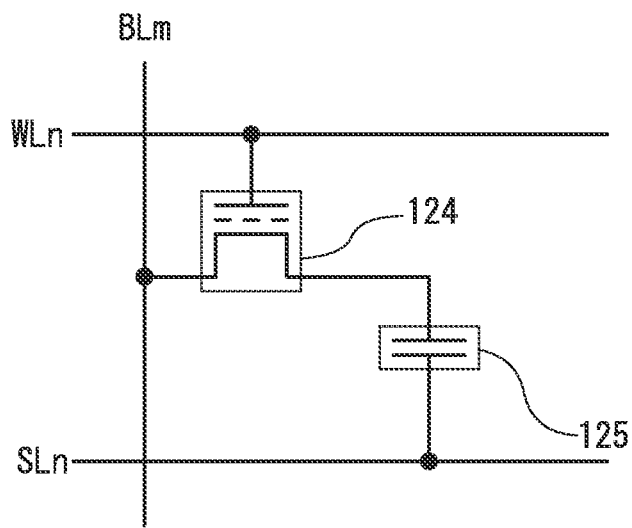

Note that the memory cell may have a structure including a transistor 124 and a capacitor 125 as illustrated in FIG. 4B. For example, to the memory cell in the n-th row and m-th column, a word line WLn, a bit line BLm, and a source line SLn are connected. The method for correcting the threshold can be similar to that in the case of FIG. 4A.

A problem here is that, in a general memory device, although the potential of one of word lines (write word lines) is designed to increase, the potentials of all the word lines are not designed to increase at once. Note that all the bit lines can be set at a low potential or a high potential.

Figure 5:
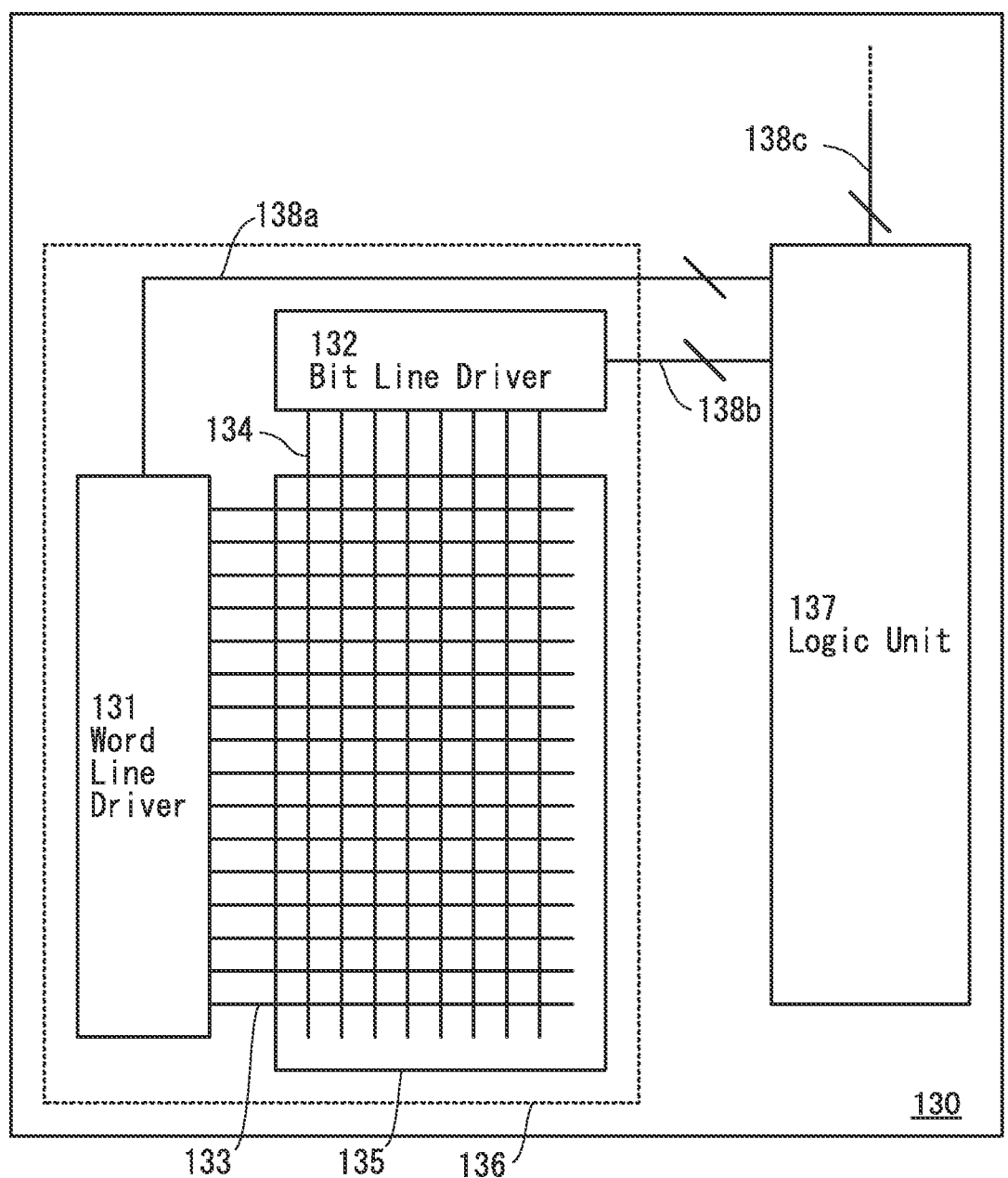
FIG. 5 illustrates an example of a semiconductor chip of an embodiment.

A semiconductor chip 130 illustrated in FIG. 5 includes a memory unit 136 and a logic unit 137. The memory unit 136 includes a memory cell array 135, the word line driver 131, and the bit line driver 132. A plurality of word lines 133 are connected to the word line driver 131, and a plurality of bit lines 134 are connected to the bit line driver 132. The memory cell illustrated in FIG. 4A or 4B is provided at the intersections of the plurality of word lines 133 and the plurality of bit lines 134.

A signal needs to be supplied to the word line driver 131 and the bit line driver 132. For example, signals are supplied to the word line driver 131 and the bit line driver 132 from the logic unit 137 through a signal line 138a and a signal line 138b. Note that a signal is supplied to the logic unit 137 through a signal line 138c.

The word line driver 131 is usually designed to select one of the plurality of word lines 133 and output a potential that turns on a transistor connected to the selected word line. For example, when the memory cell illustrated in FIG. 4A is employed, the potential of the gate electrode of the transistor 121 connected to the one selected word line is higher than the potentials of the gate electrodes of the transistors 121 connected to the unselected word lines.

To perform the threshold adjustment process, the potentials of all the bit lines 134 are set low, and the potentials of all the word lines 133 are set high. If the word line driver 131 operates at this time, the threshold adjustment process can be performed on the transistor 121 connected to the one selected word line; however, the transistors 121 connected to the other word lines need to be selected sequentially to perform the threshold adjustment process. In the case where the number of word lines is very large, it takes much time to perform the threshold adjustment process. In view of this problem, what is demanded is a structure that allows the word line driver 131 to output a potential higher than the potential of the bit lines 134 to the plurality of word lines 133 concurrently.

Figure 6:
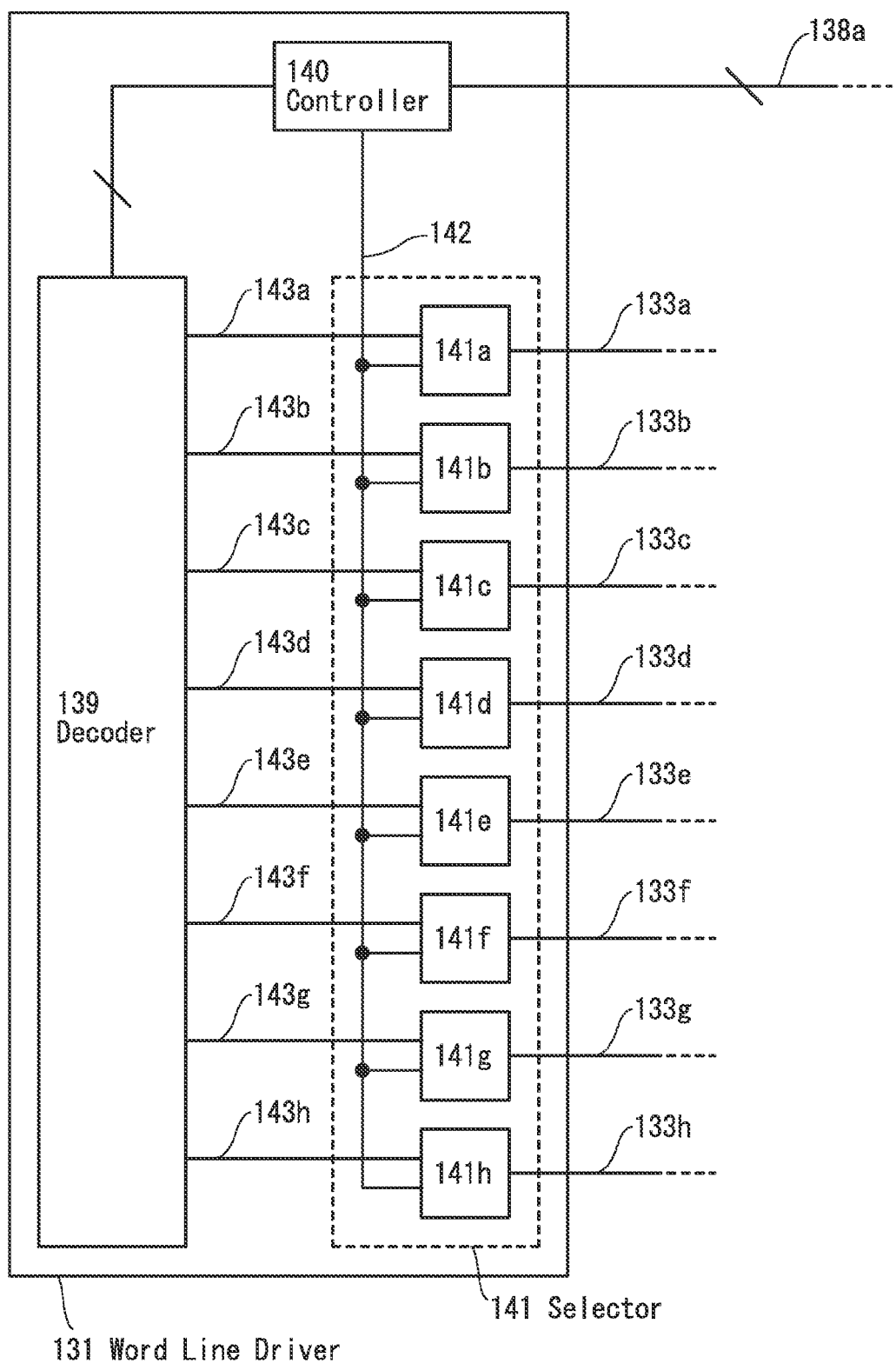
FIG. 6 illustrates an example of a circuit of an embodiment.

To solve the problem, a selector 141 that is controlled with a signal line 142 is provided inside the word line driver 131 as illustrated in FIG. 6, for example. The selector 141 is provided with selector circuits 141a to 141h, one per word line, for example. A signal from the signal line 142 and a signal from one of signal lines 143a to 143h output from a decoder 139 are input to each of the selector circuits 141a to 141h, and the selector circuits 141a to 141h output a potential to word lines 133a to 133h respectively in accordance with the input data.

Another circuit (e.g., level shifter) may be provided between the decoder 139 and the selector 141. Alternatively, a structure that transmits an output of the selector 141 to the word lines 133a to 133h through another circuit (e.g., level shifter) may be employed. Instead of the decoder 139, another type of output circuit such as a shift register can be used.

Figure 7:
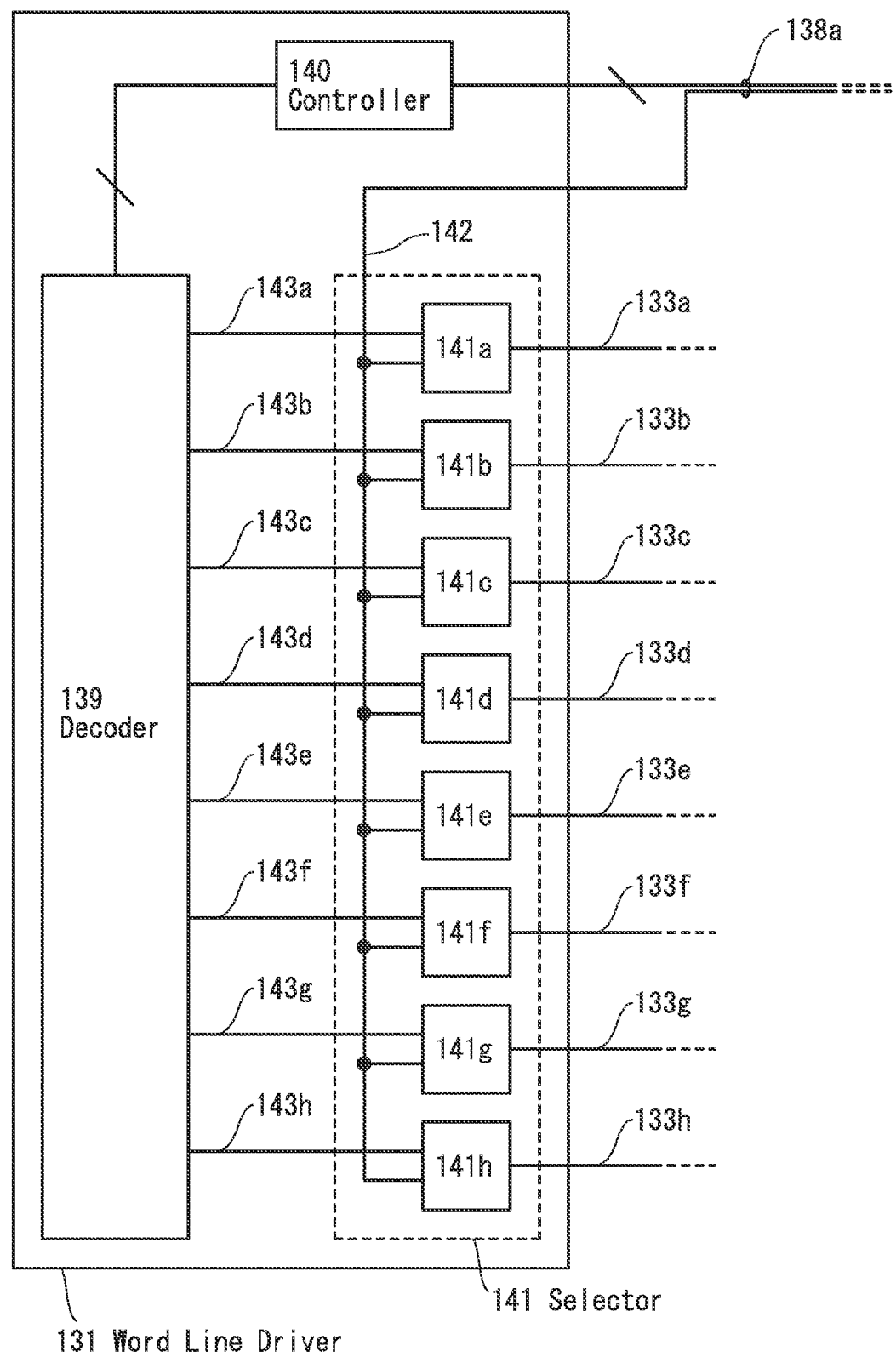
FIG. 7 illustrates an example of a circuit of an embodiment.

Although a controller 140 inside the word line driver 131 outputs a signal to the signal line 142 in FIG. 6, a structure illustrated in FIG. 7 in which the logic unit 137 outputs a signal to the signal line 142 through the signal line 138a may be employed, for example. Alternatively, a signal may be supplied to the signal line 142 from the bit line driver 132. Alternatively, a signal may be output from another circuit or a signal supply terminal.

Since the threshold adjustment process is preferably performed before shipping as described later, it is not performed frequently while in use by a user in many cases. Accordingly, the function of the threshold adjustment process need not necessarily be involved in a semiconductor chip. For example, the signal line 142 is connected to a signal supply pad, and an appropriate signal is applied thereto in the threshold adjustment process. After the process, a short circuit may be caused between the signal line 142 and a wiring or the like having a ground potential or another appropriate potential are short-circuited so that the selector 141 may output only a signal from the decoder 139. A special signal supply pad for supplying power to the selector 141 may be provided.

Considering that the threshold adjustment process is performed at higher temperature than the normal usage temperature, it is sometimes favorable to prevent application of a potential difference to the word line driver 131 except the selector 141, the bit line driver 132, the logic unit 137, and the like. In this case, by providing a terminal for supplying a special potential or special signal only to the selector 141, a load on the word line driver 131 except the selector 141, the bit line driver 132, the logic unit 137, and the like can be reduced.

Figure 8A:
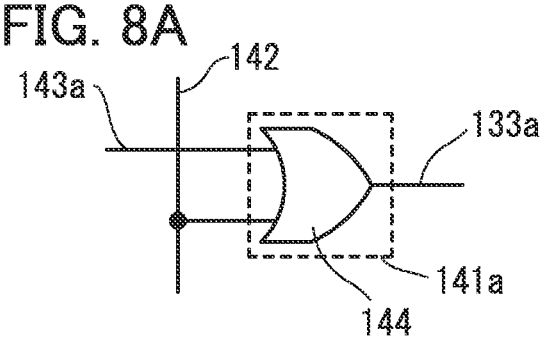
FIGS. 8A to 8C illustrate examples of a circuit of an embodiment.
Figure 8B:
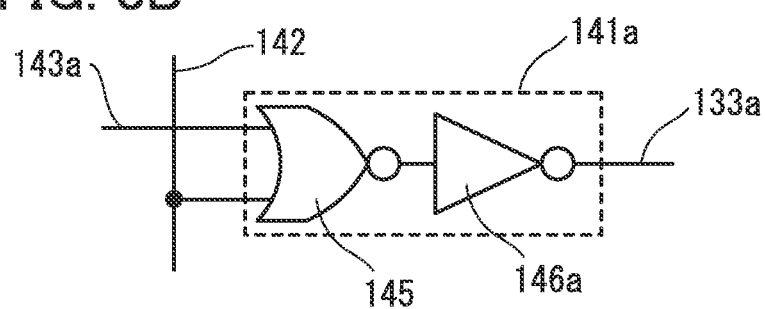
Figure 8C:
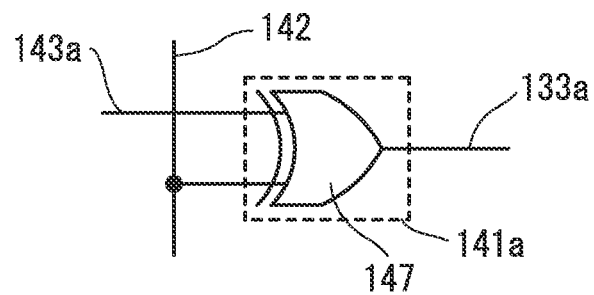

FIGS. 8A to 8C illustrate examples of the circuit used as the selector circuits 141a to 141h. FIG. 8A illustrates a case of using an OR gate 144 as the selector circuit 141a. The OR gate 144 outputs a high potential to the word line 133a if one or both of the potential of the signal line 142 and the potential of the signal line 143a are high, and outputs a low potential if both of the potentials are low.

Hence, for example, even when the potential of the signal line 143a is low, if the potential of the signal line 142 is high, the potential of the word line 133a becomes high. In FIG. 6 or FIG. 7, even in a state where the decoder 139 supplies a low potential to all of the signal lines 143a to 143h, by setting the potential of the signal line 142 at a high potential, the potentials of all the word lines 133a to 133h become high, whereby the threshold adjustment process can be performed.

During the use of the semiconductor chip 130, by making the potential of the signal line 142 always low, the potential of the word line 133a is the same as the potential of the signal line 143a.

In general, in the case of forming an OR gate using a CMOS, the output of a NOR gate is inverted. In this case, the selector circuit 141a of FIG. 8A can be represented as a structure in which a NOR gate 145 and an inverter 146a are connected as illustrated in FIG. 8B.

FIG. 8C illustrates a case of using an XOR gate 147 as the selector circuit 141a. The XOR gate 147 outputs a high potential to the word line 133a when either the potential of the signal line 142 or the potential of the signal line 143a is high and the other is low, and outputs a low potential in the other cases.

Hence, for example, even when the potential of the signal line 143a is low, if the potential of the signal line 142 is high, the potential of the word line 133a becomes high. In FIG. 6 and FIG. 7, even in a state where the decoder 139 supplies a low potential to all of the signal lines 143a to 143h, by setting the potential of the signal line 142 at a high potential, the potentials of all the word lines 133a to 133h become high and thereby the threshold adjustment process can be performed.

During the use of the semiconductor chip 130, by making the potential of the signal line 142 always low, the potential of the word line 133a becomes the same as the potential of the signal line 143a.

Figure 9A:
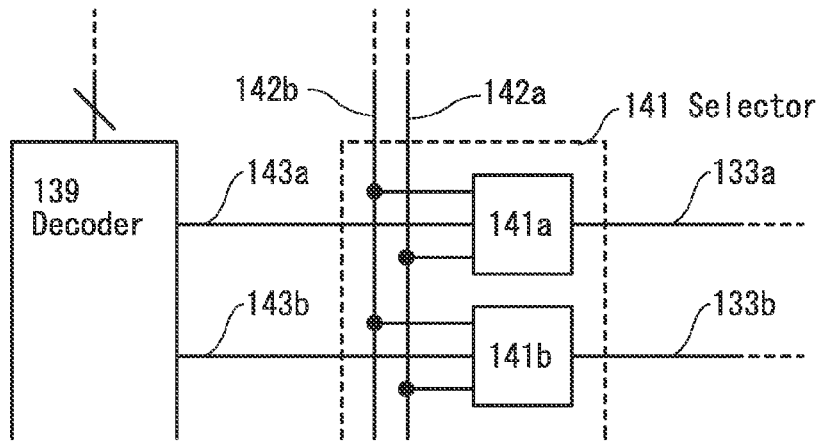
FIGS. 9A to 9C illustrate examples of a circuit of an embodiment.

Although a signal from one signal line 142 is input to each of the selector circuits 141a to 141h in the examples illustrated in FIG. 6 and FIG. 7, signals from a plurality of signal lines may be input to each of the selector circuits 141a to 141h. For example, as illustrated in FIG. 9A, signals from a signal line 142a and a signal line 142b may be input to the selector circuit 141a. The signal from the signal line 142a may be an inversion signal of the signal from the signal line 142b (i.e., when the signal from the signal line 142a has a high potential, the signal from the signal line 142b has a low potential; when the signal from the signal line 142a has a low potential, the signal from the signal line 142b has a high potential).

For example, when the OR gate or the XOR gate illustrated in FIGS. 8A to 8C is formed with a CMOS logic, three n-channel transistors and three p-channel transistors, six transistors in total, are necessary. Of the six transistors, one n-channel transistor and one p-channel transistor are used in an XOR gate to generate an inversion signal of one input. However, if it is possible to prepare the signal line 142b that supplies an inversion signal of the signal from the signal line 142a in advance and input the inversion signal to the selector circuit 141a, the XOR operation can be performed using two n-channel transistors and two p-channel transistors.

FIG. 10A illustrates an example of this. The selector circuit 141a includes a transmission gate 149a, a p-channel transistor 150a, and an n-channel transistor 151a. The selector circuit 141a illustrated in FIG. 10A is the one obtained by removing an inverter from a general XOR gate. Here, the signal from the signal line 142a is an inversion signal of the signal from the signal line 142b. If either the potential of the signal line 142b or the potential of the signal line 143a is high and the other is low, the potential of the word line 133a becomes high; in the other cases, the potential of the word line 133a becomes low.

Note that a low potential and a high potential are supplied to the signal line 142a and the signal line 142b, respectively only in the threshold adjustment process, and a high potential and a low potential are supplied to the signal line 142a and the signal line 142b, respectively while in use of the semiconductor chip 130 except the period of the threshold adjustment process.

Accordingly, during the threshold adjustment process, the transmission gate 149a is off. In addition, the potential of the signal line 143a is kept at a low potential; consequently, the p-channel transistor 150a is on and the n-channel transistor 151a is off. Thus, the potential of the signal line 142b is output to the word line 133a.

While in use of the semiconductor chip 130 except the period of the threshold adjustment process, the transmission gate 149a is on, which is established by supplying a high potential and a low potential to the signal line 142a and the signal line 142b respectively; at this time, the p-channel transistor 150a and the n-channel transistor 151a are not necessary.

In consideration of this, the absence of the n-channel transistor 151a does not result in any inconvenience for circuit operation. Therefore, the circuit can be integrated to a higher degree by decreasing the number of transistors as in FIG. 10B. Note that the p-channel transistor 150a is on during the threshold adjustment process. Since a high switching speed is not required at that time, the p-channel transistor 150a may have a minimum channel width. Thus, an increase in circuit area caused by adding the selector circuit 141a can be minimized.

Figure 9B:
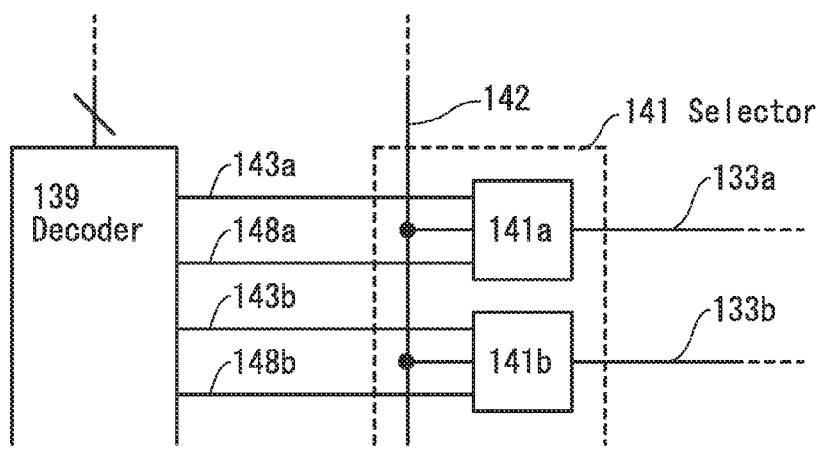

As in FIG. 9B, signals output from the decoder 139 may be input to the selector circuit 141a and the selector circuit 141b through a signal line 148a and a signal line 148b respectively. Here, the signal from the signal line 148a may be an inversion signal of the signal from the signal line 143a.

Figure 11A:
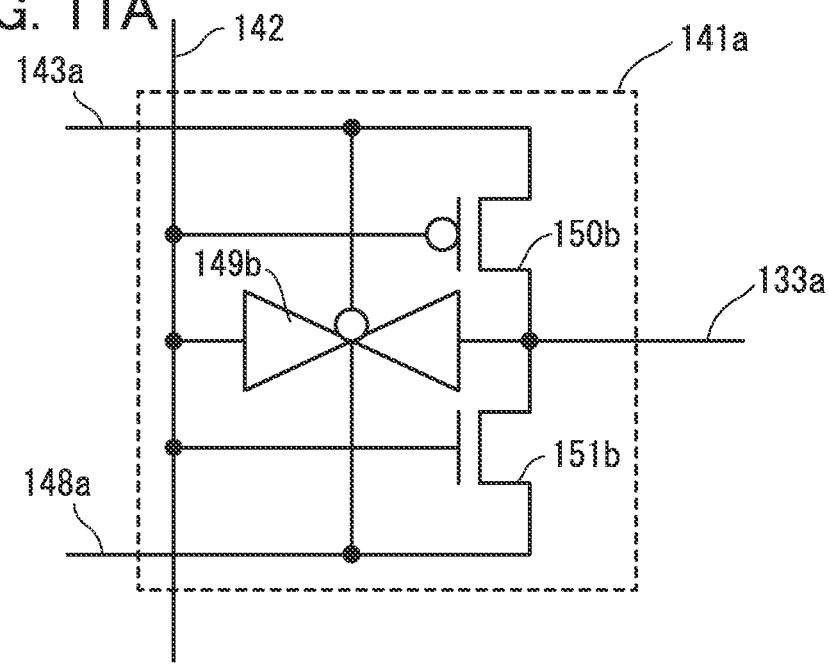
FIGS. 11A and 11B illustrate examples of circuits of an embodiment.

For example, the selector circuit 141a illustrated in FIG. 11A includes a transmission gate 149b, a p-channel transistor 150b, and an n-channel transistor 151b. Here, the signal from the signal line 148a is an inversion signal of the signal from the signal line 143a. If either the potential of the signal line 143a or the potential of the signal line 148a is high and the other is low, the potential of the word line 133a becomes high; in the other cases, the potential of the word line 133a becomes low. The selector circuit 141a illustrated in FIG. 11A can perform the XOR operation using the potential input to the signal line 142 and the potential input to the signal line 143a.

Figure 11B:
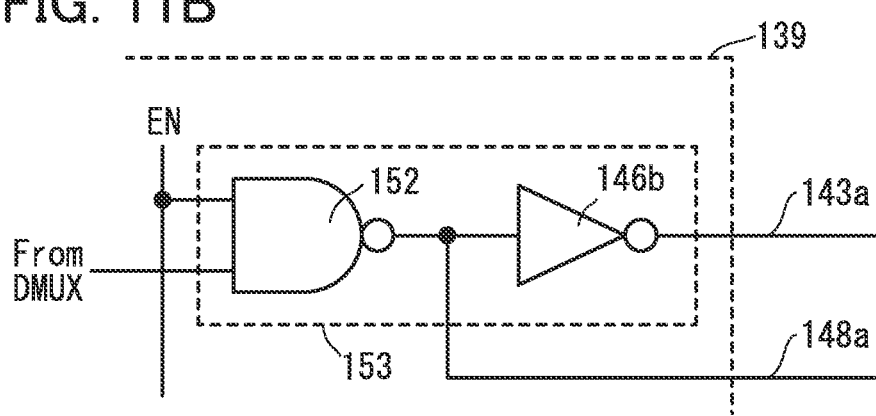

To obtain one signal and an inversion signal thereof from the decoder 139, the signal line 143a or the like may be provided with an inverter. For example, at the last stage of the decoder 139, an output of a demultiplexer (not illustrated) and an enable signal EN are input to an AND gate in some cases. As illustrated in FIG. 11B, in general, an AND gate 153 inverses an output of a NAND gate 152 at an inverter 146b; accordingly, the output of the NAND gate 152 is an inversion signal of the signal from the signal line 143a. Hence, the output of the NAND gate 152 can be obtained as the signal from the signal line 148a.

Without limiting to this example, the inversion signal of the signal from the signal line 143a can be obtained from an appropriate place in the decoder 139 or the word line driver 131.

Figure 9C:
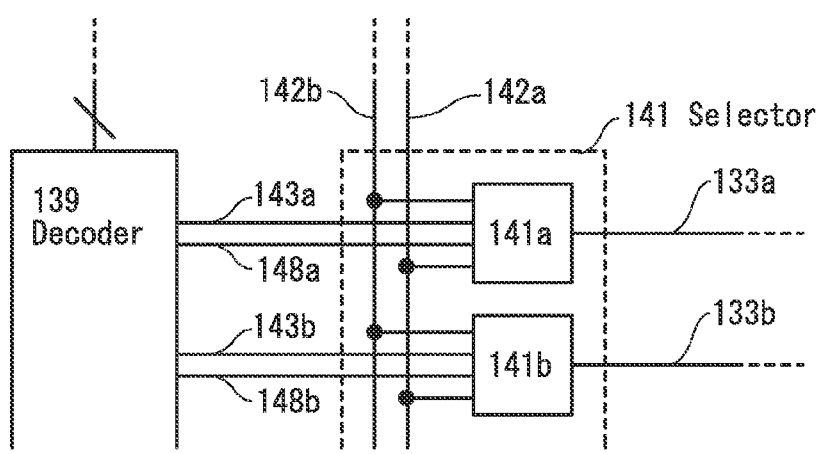

As in FIG. 9C, a structure may be employed in which signals output from the decoder 139 are input to the selector circuit 141a through a plurality of signal lines, and in addition signals from the signal line 142a and the signal line 142b are input to the selector circuit 141a. Here, the signal from the signal line 142a may be an inversion signal of the signal from the signal line 142b. In addition or alternatively, the signal from the signal line 148a may be an inversion signal of the signal from the signal line 143a.

The case of using a logic gate as the selector circuit 141a described above is a non-limiting example. For example, selection of either the signal from the signal line 143a or the inversion signal thereof may be performed by the selector circuit 141a.

Figure 12A:
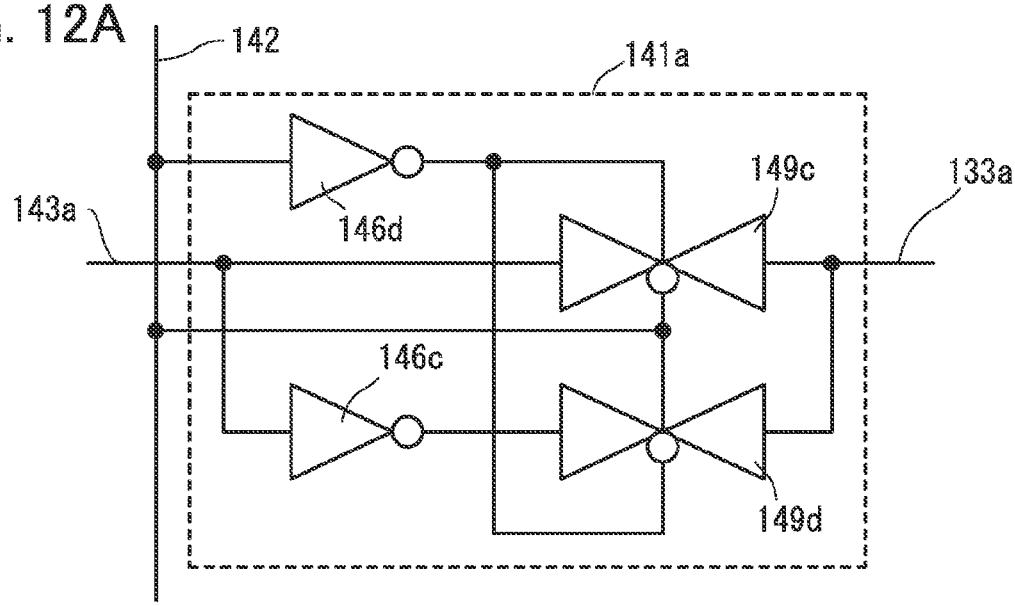
FIGS. 12A to 12C illustrate examples of a circuit of an embodiment.

FIG. 12A illustrates an example, in which the inversion signal of the signal from the signal line 143a is generated by an inverter 146c, and a transmission gate 149c and a transmission gate 149d select which signal to output to the word line 133a, the signal from the signal line 143a or the inversion signal thereof. Since the signal from the signal line 142 and the inversion signal thereof need to be input to the transmission gate 149c and the transmission gate 149d, the inversion signal of the signal from the signal line 142 is generated by an inverter 146d.

In the selector circuit 141a illustrated in FIG. 12A, the signal line 142 is set at a high potential and the signal line 143a is set at a low potential during the threshold adjustment process. As a result, the transmission gate 149c is off and the transmission gate 149d is on, so that the inversion signal of the signal from the signal line 143a, that is, a high potential, is output to the word line 133a.

While in use of the semiconductor chip 130 except the period of the threshold adjustment process, the signal line 142 is kept at a low potential. As a result, the transmission gate 149c is on and the transmission gate 149d is off, so that the potential of the signal from the signal line 143a is output to the word line 133a.

Only during the threshold adjustment process, the inversion signal of the signal from the signal line 143a is output to the word line 133a. At this time, because the inversion signal has a high potential, the transmission gate 149d can be replaced with a p-channel transistor. The p-channel transistor may have a minimum size.

Figure 12B:
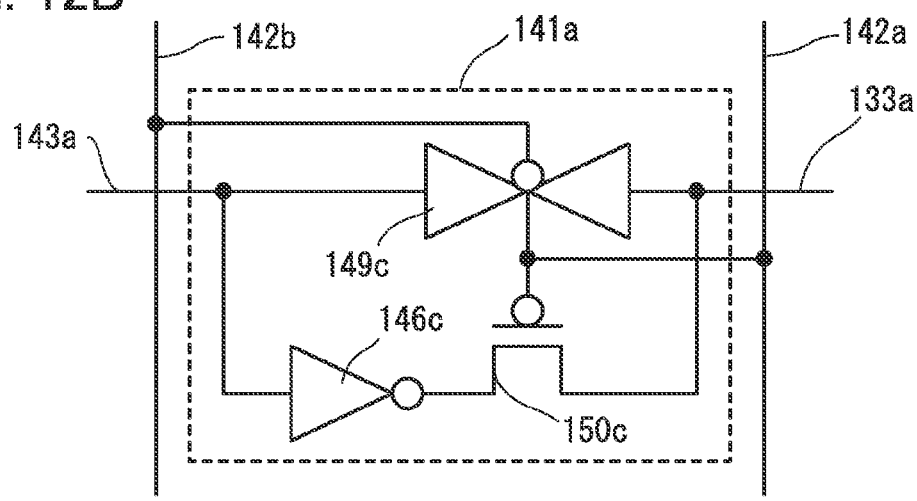

As illustrated in FIG. 9A, in the case where the signal line 142a and the signal line 142b are connected to the selector circuit 141a and the signal from the signal line 142b is the inversion signal of the signal from the signal line 142a, the inverter 146d is not necessary, which is illustrated in FIG. 12B. Note that in FIG. 12B, the transmission gate 149d of FIG. 12A is replaced with a p-channel transistor 150c. Consequently, the total number of transistors in the selector circuit 141a is five.

In the selector circuit 141a illustrated in FIG. 12B, the signal line 142a is set at a low potential, the signal line 142b is set at a high potential, and the signal line 143a is set at a low potential during the threshold adjustment process. As a result, the transmission gate 149c is off and the p-channel transistor 150c is on, so that the inversion signal of the signal from the signal line 143a, that is, a high potential, is output to the word line 133a.

While in use of the semiconductor chip 130 except the period of the threshold adjustment process, the signal line 142a is kept at a high potential, and the signal line 142b is kept at a low potential. As a result, the transmission gate 149c is on and the p-channel transistor 150c is off, so that the potential of the signal from the signal line 143a is output to the word line 133a.

Figure 12C:
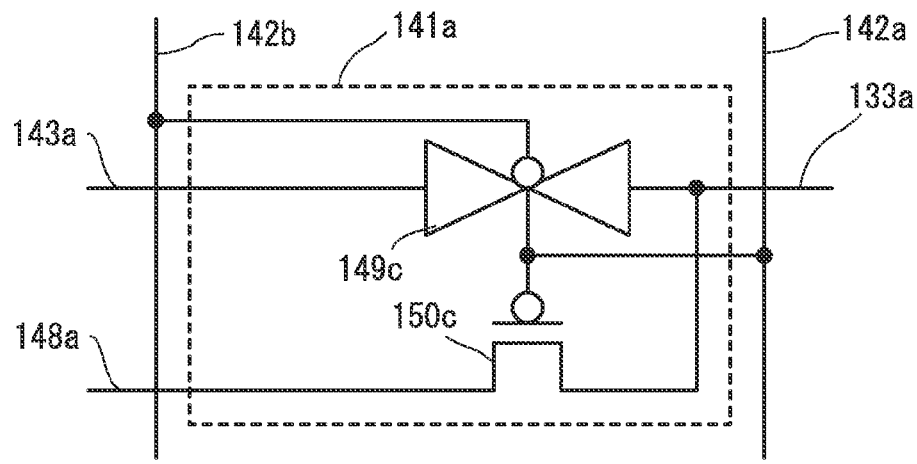

In the case where the signal line 148a is further connected to the selector circuit 141a and the signal from the signal line 148a is the inversion signal of the signal from the signal line 143a as illustrated in FIG. 9C, the inverter 146c is not necessary, which is illustrated in FIG. 12C. Consequently, the total number of transistors in the selector circuit 141a is three.

In the selector circuit 141a illustrated in FIG. 12C, the signal line 142a is set at a low potential, the signal line 142b is set at a high potential, the signal line 143a is set at a low potential, and the signal line 148a is set at a high potential during the threshold adjustment process. As a result, the transmission gate 149c is off and the p-channel transistor 150c is on, so that the signal from the signal line 148a, that is, a high potential, is output to the word line 133a.

While in use of the semiconductor chip 130 except the period of the threshold adjustment process, the signal line 142a is kept at a high potential, and the signal line 142b is kept at a low potential. As a result, the transmission gate 149c is on and the p-channel transistor 150c is off, so that the potential of the signal from the signal line 143a is output to the word line 133a.

Only during the threshold adjustment process, the p-channel transistor 150c is on, and at that time, the potential of the word line 133a needs to be high. The structure of FIG. 12C relies on the signal line 148a for the potential of the word line 133a; however, other lines as well as the signal line 148a also have a high potential during the threshold adjustment process. For example, the signal line 142b also has a high potential, and with this potential, the potential of the word line 133a may be made high. In this case, the signal line 148a need not be provided.

During the threshold adjustment process, the p-channel transistor 150c needs to be on; therefore, the gate thereof is kept at a low potential at that time. The structure of FIG. 12C relies on the signal line 142a for the potential of the gate of the p-channel transistor 150c; however, other lines as well as the signal line 142a also have a low potential during the threshold adjustment process. For example, the signal line 143a also has a low potential, and with this potential, the p-channel transistor 150c can be turned on. In this case the circuit configuration is the same as that of the circuit illustrated in FIG. 10B.

By using the above-described word line driver 131, all the word lines 133 can be set at a high potential (e.g., 2 V). Moreover, all the bit lines 134 can be set at a low potential (e.g., 0 V) to perform the threshold adjustment process by the aforementioned method.

For example, if the memory cell illustrated in FIG. 4A is included, the potential of one of the source electrode and the drain electrode of the transistor 121, which is connected to the bit line BLm, is 0 V. Here, assuming that the threshold of the transistor 121 before the threshold adjustment process is 1 V, the other of the source electrode and the drain electrode right after the start of the threshold adjustment process is 0 V because the transistor 121 is in an on state.

Then, by the above-described process, electrons are trapped in the charge trap layer 102, which increases the threshold. In this case, the threshold increases to +2 V at a maximum. Thus, the threshold adjustment process can be performed on the transistors 121 in all the memory cells.

Since the thresholds of the transistors 121 on which the threshold adjustment process has been performed are high enough, Icut is extremely small. Accordingly, charge stored in the capacitor 123 can be held for a long time while the power supply from the outside is stopped.

Figure 13:
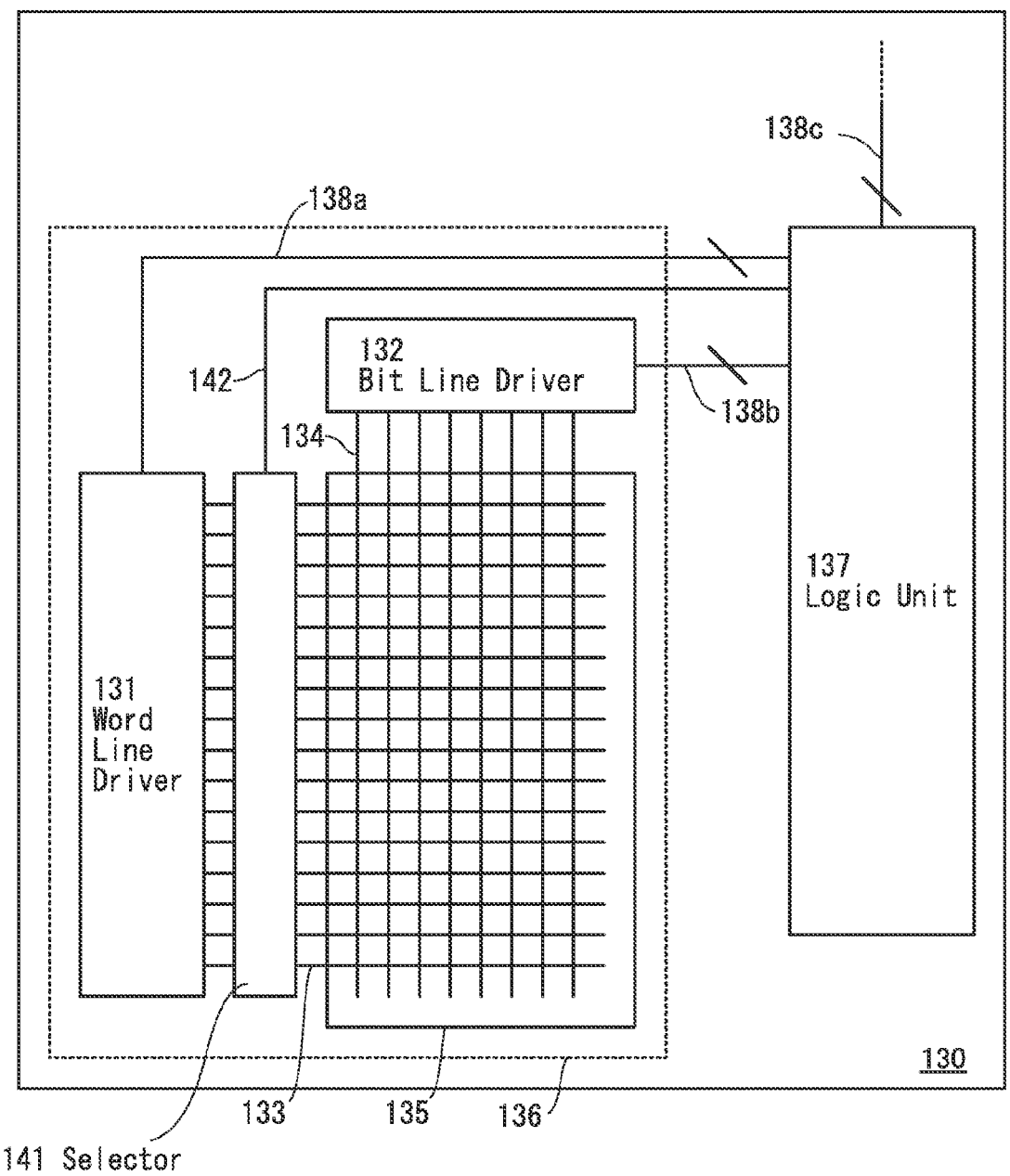
FIG. 13 illustrates an example of a semiconductor chip of an embodiment.

Note that the selector 141 is not necessarily provided only in the word line driver 131. As illustrated in FIG. 13, the selector 141 may be provided between the the word line driver 131 and the memory cell array 135. The signal line 142 connected to the selector 141 may be connected to the word line driver 131 or the bit line driver 132 for example, as well as the connection to the logic unit 137, as illustrated in FIG. 13. Alternatively, a signal supplied to the signal line 142 may be supplied from the word line driver 131 or the bit line driver 132, as well as the supply from the logic unit 137.

Figure 14A:
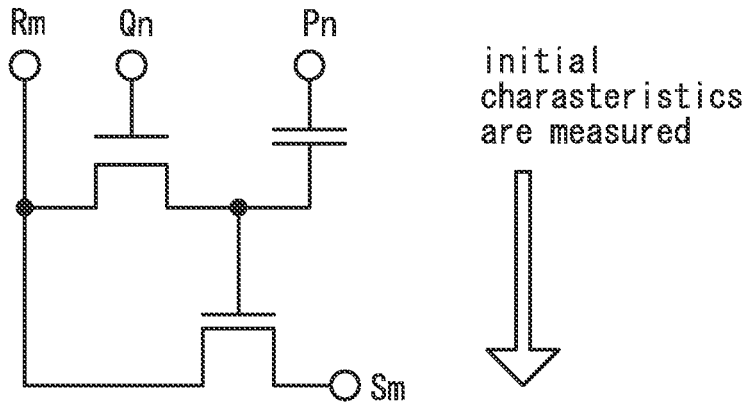
FIGS. 14A to 14C illustrate an example of a manufacturing process of a semiconductor device.

The threshold adjustment process is preferably performed before shipping of the semiconductor device including the memory cells. For example, steps illustrated in FIGS. 14A to 14C can be performed. After memory cells are formed, first, initial characteristics are measured to select a conforming item (see FIG. 14A). Here, items without malfunctions that cannot be recovered due to a break in a wire or the like are regarded as conforming items. At this stage, the threshold has not been adjusted to an appropriate value and thus charge in the capacitor cannot be held for a long time; however, this is not the criterion of selection.

Figure 14B:
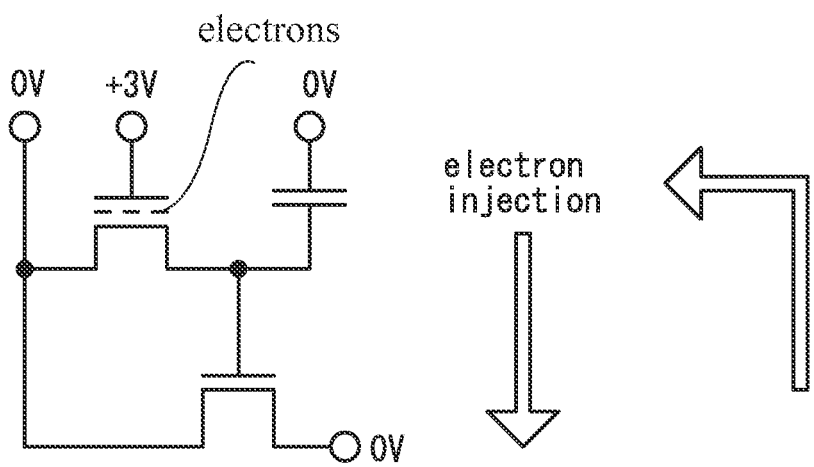

Then, electrons are injected as illustrated in FIG. 14B. An appropriate number of electrons are trapped in the charge trap layer. This operation is performed in the above-described manner. At this stage, the difference between the potential of the gate electrode 103 and the potential of the one with the lower potential of the source electrode and the drain electrode (gate voltage) is more than or equal to 1 V and less than 4V and, in addition, less than or equal to the gate voltage after shipment of this memory cell.

Figure 14C:
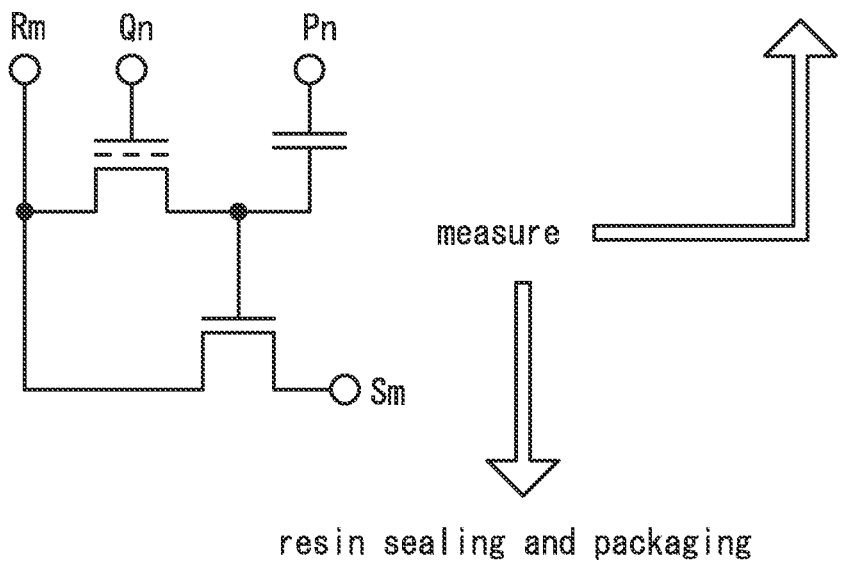

Then, measurement is performed again as illustrated in FIG. 14C. One of the criteria for conforming items is the threshold increased as planned. At this stage, chips with a threshold abnormality are regarded as nonconforming items, and these chips may again be subjected to electron injection. Conforming items are shipped after dicing, wire bonding, resin sealing, and packaging.

The increase in the threshold depends on the density of electrons trapped by the charge trap layer 102. For example, in the semiconductor device illustrated in FIG. 1B, in the case where electrons are trapped only at the interface between the first insulating layer 102a and the second insulating layer 102b, the threshold is increased by Q/C, where Q is the surface density of trapped electrons and C is the dielectric constant of the first insulating layer 102a.

As described above, the potential of the gate electrode 103 determines the value at which the number of trapped electrons converges. Accordingly, the increase in the threshold can be adjusted by the potential of the gate electrode 103.

As an example, a case in which the potential of the gate electrode 103 is set higher than the potentials of the source electrode and the drain electrode by 1.5 V and the temperature is set at higher than or equal to 150° C. and lower than or equal to 250° C. typically 200° C.±20° C. is considered. Assuming that the threshold of the semiconductor device before electrons are trapped in the charge trap layer 102 (first threshold, Vth1) is +1.1 V, a channel is formed in the semiconductor layer 101 at first and electrons are trapped in the charge trap layer 102. Then, the number of trapped electrons in the charge trap layer 102 increases, and the channel disappears. At this stage, trap of electrons in the charge trap layer 102 stops.

In this case, because the channel disappears when the potential of the gate electrode 103 is higher than the potentials of the source electrode and the drain electrode by 1.5 V, the threshold becomes +1.5 V. It can also be said that the threshold is increased by 0.4 V by electrons trapped in the charge trap layer 102. The threshold that has been changed by electrons trapped in the charge trap layer 102 is referred to as a second threshold (Vth2).

By utilizing these characteristics, the thresholds of a plurality of semiconductor devices which are initially largely different from each other can converge at values within an appropriate range. For example, if three semiconductor devices with the first thresholds of +1.2 V, +1.1 V, and +0.9 V are subjected to the process under above-described conditions, trap of electrons does not make the threshold to become significantly higher than +1.5 V in each semiconductor device; the second threshold of each semiconductor device can become approximately +1.5 V. For example, the variation in threshold (e.g., standard deviation) can be reduced to a quarter of the initial variation by the threshold adjustment process.

Note that after the thresholds of the transistors are changed by the threshold adjustment process, the number of trapped electrons in the charge trap layer 102 (or the surface density of electrons, or the like) is different among the three semiconductor devices.

Any of a variety of materials can be used for the gate electrode 103. For example, a conductive layer of Al, Ti, Cr, Co, Ni, Cu, Y, Zr, Mo, Ru, Ag, Ta, W, or the like can be used. The gate electrode 103 may have a stacked-layer structure of any of the above materials. Alternatively, a conductive layer containing nitrogen may be used as the gate electrode 103. For example, a titanium nitride layer over which a tungsten layer is stacked, a tungsten nitride layer over which a tungsten layer is stacked, a tantalum nitride layer over which a tungsten layer is stacked, or the like can be used as the gate electrode 103.

Note that the work function of the gate electrode 103 that faces the semiconductor layer 101 is one factor determining the threshold of the semiconductor device; in general, as the work function of a material is smaller, the threshold becomes lower. However, as described above, the threshold can be adjusted by adjusting the number of trapped electrons in the charge trap layer 102; accordingly, the range of choices for the material of the gate electrode 103 can be widened.

Any of a variety of materials can be used for the semiconductor layer 101. For example, other than silicon, germanium, and silicon germanium, any of a variety of oxide semiconductors described later can be used.

Any of a variety of materials can be used for the first insulating layer 102a. For example, an insulating layer containing one or more kinds selected from magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide can be used.

The second insulating layer 102b can be formed using any of a variety of materials. For example, an insulating layer including one or more kinds selected from silicon nitride, hafnium oxide, aluminum oxide, aluminum silicate, and the like can be used.

The third insulating layer 102c can be formed using any of a variety of materials. For example, an insulating layer including one or more kinds selected from magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide can be used.

Thus, the semiconductor device in which a necessary number of electrons are trapped in the charge trap layer 102 is the same as a normal MOS semiconductor device. That is, the charge trap layer 102 serves as a gate insulating layer.

Note that the timing of the threshold adjustment process is not limited to that described above and may be any of the following timings before leaving the factory, for example: after formation of a wiring connected to the source electrode or the drain electrode of the semiconductor device, after backplane process (wafer process), after wafer dicing, and after packaging. In either case, it is preferable that the semiconductor device be not exposed to temperatures of 125° C. or higher for 1 hour or more after the threshold adjustment process.

In the above-described example, the threshold of the semiconductor device is adjusted to an appropriate value by trap of electrons in the charge trap layer 102. However, depending on the materials of the charge trap layer 102 and the semiconductor layer 101, holes might be trapped in the charge trap layer 102; in this case, the threshold is lowered and can be adjusted to an appropriate value, according to the similar principle.

Embodiment 2

In this embodiment, a semiconductor device which is one embodiment disclosed in this specification is described with reference to drawings.

Figure 15A:
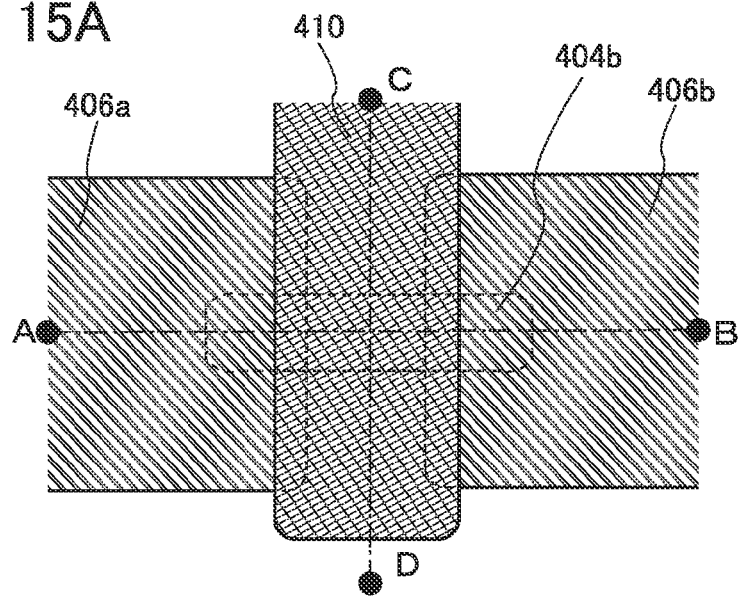
FIGS. 15A to 15C are a top view and cross-sectional views of an example of a transistor.
Figure 15B:
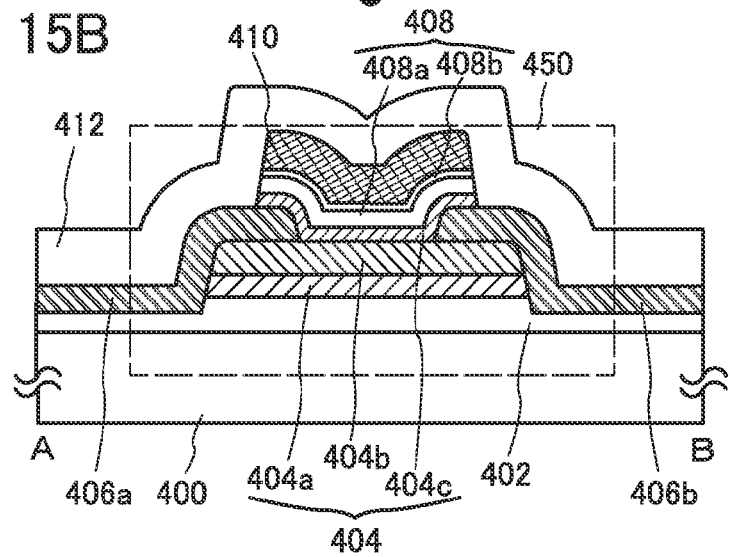
Figure 15C:
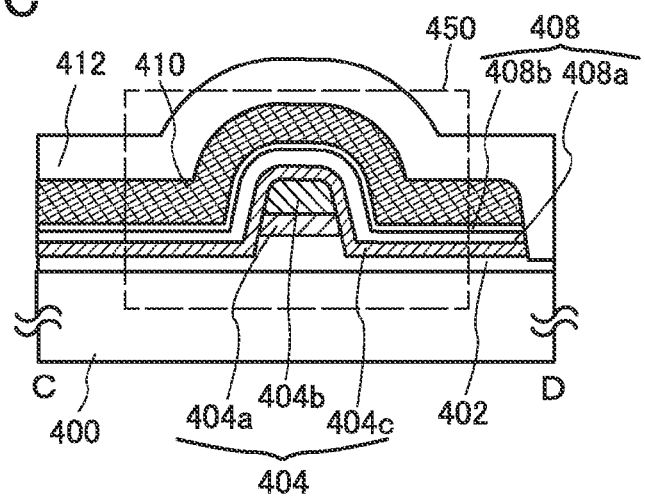

FIGS. 15A to 15C are a top view and cross-sectional views illustrating a transistor of one embodiment disclosed in this specification. FIG. 15A is the top view, FIG. 15B illustrates a cross section taken along the dashed-dotted line A-B in FIG. 15A, and FIG. 15C illustrates a cross section taken along the dashed-dotted line C-D in FIG. 15A. Note that for drawing simplicity, some components are not illustrated in the top view of FIG. 15A. In some cases, the direction of the dashed-dotted line A-B is referred to as a channel length direction, and the direction of the dashed-dotted line C-D is referred to as a channel width direction.

A transistor 450 illustrated in FIGS. 15A to 15C includes a substrate 400; a base insulating layer 402 having a depression portion and a projection portion over the substrate 400; an oxide semiconductor layer 404a and an oxide semiconductor layer 404b over the projection portion of the base insulating layer 402; a source electrode 406a and a drain electrode 406b over the oxide semiconductor layer 404a and the oxide semiconductor layer 404b; an oxide semiconductor layer 404c in contact with the depression portion of the base insulating layer 402, a side surface of the projection portion (depression portion) of the base insulating layer 402, a side surface of the oxide semiconductor layer 404a, a side surface and a top surface of the oxide semiconductor layer 404b, the source electrode 406a, and the drain electrode 406b; a gate insulating layer 408 over the oxide semiconductor layer 404c; a gate electrode 410 provided over and in contact with the gate insulating layer 408 and facing the top surface and the side surface of the oxide semiconductor layer 404b, and an oxide insulating layer 412 over the source electrode 406a, the drain electrode 406b, and the gate electrode 410.

The gate insulating layer 408 functions as the charge trap layer described in Embodiment 1. Here, the gate insulating layer 408 has a stacked structure including a first insulating layer 408a formed by a CVD method and a second insulating layer 408b formed thereover by a sputtering method. However, the gate insulating layer 408 may further include an insulating layer formed thereover by a CVD method (the third insulating layer 102c in Embodiment 1) as illustrated in FIG. 1C.

The oxide semiconductor layer 404a, the oxide semiconductor layer 404b, and the oxide semiconductor layer 404c are collectively referred to as a multilayer semiconductor layer 404.

In the case where a material used as the gate insulating layer 408 has a high relative dielectric constant, the gate insulating layer 408 can be formed thick. For example, in the case of using hafnium oxide with a relative dielectric constant of 16, the gate insulating layer 408 can be formed approximately four times as thick as the gate insulating layer 408 using silicon oxide with a relative dielectric constant of 3.9. The increase in the thickness of the gate insulating layer 408 is preferable in terms of preventing the leakage of trapped electrons. Note that the thickness of the gate insulating layer 408 is more than or equal to 1 nm and less than or equal to 100 nm, typically more than or equal to 5 nm and less than or equal to 20 nm.

Note that the channel length refers to the distance between a source (a source region, source electrode) and a drain (drain region, drain electrode) in a region where a semiconductor layer overlaps with a gate electrode in the top view. That is, the channel length in FIG. 15A is the distance between the source electrode 406a and the drain electrode 406b in the region where the oxide semiconductor layer 404b overlaps with the gate electrode 410. The channel width refers to the width of a source or a drain in a region where a semiconductor layer overlaps with a gate electrode. That is, the channel width in FIG. 15A is the width of the source electrode 406a or the drain electrode 406b in the region where the semiconductor layer 404b overlaps with the gate electrode 410.

When the gate insulating layer 408 functions as a charge trap layer, electrons can be trapped in charge trap states existing inside the layer as described in Embodiment 1. The number of electrons trapped in the charge trap states can be adjusted by the potential of the gate electrode 410.

The gate electrode 410 electrically covers the oxide semiconductor layer 404b, increasing the on-state current. This transistor structure is referred to as a surrounded channel (s-channel) structure. In the s-channel structure, a current flows through an entire region of the oxide semiconductor layer 404b (bulk). Since a current flows through the oxide semiconductor layer 404b, an adverse effect of interface scattering is unlikely to occur, leading to a high on-state current. Note that as the oxide semiconductor layer 404b is thicker, the on-state current can be increased.

In formation of a transistor with a short channel length and a short channel width, when an electrode, a semiconductor layer, or the like is processed at the same time when a resist mask is recessed, the electrode, the semiconductor layer, or the like has a rounded upper end portion (curved surface) in some cases. With this structure, the coverage with the gate insulating layer 408, the gate electrode 410, and the oxide insulating layer 412, which are to be formed over the oxide semiconductor layer 404b, can be improved. In addition, electric field concentration that might occur at end portions of the source electrode 406a and the drain electrode 406b can be reduced, which can suppress deterioration of the transistor.

By miniaturization of the transistor, a high degree of integration and a high density can be achieved. For example, the channel length of the transistor is less than or equal to 100 nm, preferably less than or equal to 40 nm, further preferably less than or equal to 30 nm, and still further preferably less than or equal to 20 nm, and the channel width of the transistor is less than or equal to 100 nm, preferably less than or equal to 40 nm, further preferably less than or equal to 30 nm, and still further preferably less than or equal to 20 nm. Even with such a narrow channel, a transistor of one embodiment disclosed in this specification can increase the on-state current by having the s-channel structure.

The substrate 400 is not limited to a simple supporting substrate, and may be a substrate where another device such as a transistor is formed. In that case, at least one of the gate electrode 410, the source electrode 406a, and the drain electrode 406b of the transistor 450 may be electrically connected to the above device.

The base insulating layer 402 can have a function of supplying oxygen to the multilayer semiconductor layer 404 as well as a function of preventing diffusion of impurities from the substrate 400. In the case where the substrate 400 is provided with another device as described above, the base insulating layer 402 also has a function as an interlayer insulating layer. In that case, since the base insulating layer 402 has an uneven surface, the base insulating layer 402 is preferably subjected to planarization treatment such as chemical mechanical polishing (CMP) treatment so as to have a flat surface.

The multilayer semiconductor layer 404 in the channel formation region of the transistor 450 has a structure in which the oxide semiconductor layer 404a, the oxide semiconductor layer 404b, and the oxide semiconductor layer 404c are stacked in this order from the substrate 400 side. The oxide semiconductor layer 404b is surrounded by the oxide semiconductor layer 404a and the oxide semiconductor layer 404c. As in FIG. 15C, the gate electrode 410 electrically covers the oxide semiconductor layer 404b.

Here, for the oxide semiconductor layer 404b, for example, an oxide semiconductor whose electron affinity (an energy difference between a vacuum level and the conduction band minimum) is higher than those of the oxide semiconductor layer 404a and the oxide semiconductor layer 404c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layer 404a and the oxide semiconductor layer 404c each contain one or more kinds of metal elements forming the oxide semiconductor layer 404b. For example, the oxide semiconductor layer 404a and the oxide semiconductor layer 404c are preferably formed using an oxide semiconductor whose conduction band minimum is closer to a vacuum level than that of the oxide semiconductor layer 404b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the gate electrode 410, a channel is formed in the oxide semiconductor layer 404b where the conduction band minimum is the lowest in the multilayer semiconductor layer 404. In other words, the oxide semiconductor layer 404c is formed between the oxide semiconductor layer 404b and the gate insulating layer 408, whereby a structure in which the channel of the transistor is provided in a region that is not in contact with the gate insulating layer 408 is obtained.

Further, since the oxide semiconductor layer 404a contains one or more metal elements contained in the oxide semiconductor layer 404b, an interface state is unlikely to be formed at the interface between the oxide semiconductor layer 404b and the oxide semiconductor layer 404a, compared with the interface between the oxide semiconductor layer 404b and the base insulating layer 402 on the assumption that the oxide semiconductor layer 404b is in contact with the base insulating layer 402. The interface state sometimes forms a channel, leading to a change in the threshold of the transistor. Thus, with the oxide semiconductor layer 404a, a variation in the electrical characteristics of the transistor, such as threshold, can be reduced. Further, the reliability of the transistor can be improved.

Furthermore, since the oxide semiconductor layer 404c contains one or more metal elements contained in the oxide semiconductor layer 404b, scattering of carriers is unlikely to occur at the interface between the oxide semiconductor layer 404b and the oxide semiconductor layer 404c, compared with the interface between the oxide semiconductor layer 404b and the gate insulating layer 408 on the assumption that the oxide semiconductor layer 404b is in contact with the gate insulating layer 408. Thus, with the oxide semiconductor layer 404c, the field-effect mobility of the transistor can be increased.

For the oxide semiconductor layer 404a and the oxide semiconductor layer 404c, for example, a material containing Al, Ti, Ga, Ge, Y, Zr, Sn, La, Ce, or Hf with a higher atomic ratio than that used for the oxide semiconductor layer 404b can be used. Specifically, an atomic ratio of any of the above metal elements in the oxide semiconductor layer 404a and the oxide semiconductor layer 404c is 1.5 times or more, preferably 2 times or more, further preferably 3 times or more as much as that in the oxide semiconductor layer 404b. Any of the above metal elements is strongly bonded to oxygen and thus has a function of suppressing generation of an oxygen vacancy in the oxide semiconductor layer 404a and the oxide semiconductor layer 404c. That is, an oxygen vacancy is less likely to be generated in the oxide semiconductor layer 404a and the oxide semiconductor layer 404c than in the oxide semiconductor layer 404b.

Note that when each of the oxide semiconductor layer 404a, the oxide semiconductor layer 404b, and the oxide semiconductor layer 404c is an In-M-Zn oxide containing at least indium, zinc, and M (M is a metal such as Al, Ti, Ga, Ge, Y, Zr, Sn, La, Ce, or Hf), and when the oxide semiconductor layer 404a has an atomic ratio of In to M and Zn which is $x_1:y_1:z_1$, the oxide semiconductor layer 404b has an atomic ratio of In to M and Zn which is $x_2:y_2:z_2$, and the oxide semiconductor layer 404c has an atomic ratio of In to M and Zn which is $x_3:y_3:z_3$, $y_1/x_1$ and $y_3/x_3$ is each preferably larger than $y_2/x_2$. $Y_1/x_1$ and $y_3/x_3$ is each 1.5 times or more, preferably 2 times or more, further preferably 3 times or more as large as $y_2/x_2$. At this time, when $y_2$ is greater than or equal to $x_2$ in the oxide semiconductor layer 404b, the transistor can have stable electrical characteristics. However, when $y_2$ is 3 times or more as large as $x_2$, the field-effect mobility of the transistor is reduced; accordingly, $y_2$ is preferably less than 3 times $x_2$.

In each of the oxide semiconductor layers 404a and 404c, the proportions of In and M when summation of In and M is assumed to be 100 atomic % are preferably as follows: the atomic percentage of In is less than 50 atomic % and the atomic percentage of M is greater than or equal to 50 atomic %; further preferably, the atomic percentage of In is less than 25 atomic % and the atomic percentage of M is greater than or equal to 75 atomic %. The proportion of In and the proportion of M in the oxide semiconductor layer 404b when summation of In and M is assumed to be 100 atomic % are preferably greater than or equal to 25 atomic % and less than 75 atomic %, respectively, further preferably greater than or equal to 34 atomic % and less than 66 atomic %, respectively.

The thicknesses of the oxide semiconductor layer 404a and the oxide semiconductor layer 404c are each greater than or equal to 3 nm and less than or equal to 100 nm, preferably greater than or equal to 3 nm and less than or equal to 50 nm. The thickness of the oxide semiconductor layer 404b is greater than or equal to 3 nm and less than or equal to 200 nm, preferably greater than or equal to 3 nm and less than or equal to 100 nm, further preferably greater than or equal to 3 nm and less than or equal to 50 nm. In addition, the oxide semiconductor layer 404b is preferably thicker than the oxide semiconductor layer 404a and the oxide semiconductor layer 404c.

For the oxide semiconductor layer 404a, the oxide semiconductor layer 404b, and the oxide semiconductor layer 404c, an oxide semiconductor containing indium, zinc, and gallium can be used, for example. Note that the oxide semiconductor layer 404b preferably contains indium because carrier mobility can be increased.

Note that stable electrical characteristics can be effectively imparted to a transistor using an oxide semiconductor layer, by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1 \times 10^{17}/cm^3$, preferably lower than $1 \times 10^5/cm_3$, further preferably lower than $1 \times 10^{13}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density. In addition, silicon in the oxide semiconductor layer forms an impurity level. The impurity level might become a trap, so that the electrical characteristics of the transistor might deteriorate. Accordingly, in the oxide semiconductor layer 404a, the oxide semiconductor layer 404b, and the oxide semiconductor layer 404c and at interfaces between these layers, the impurity concentration is preferably reduced.

In order to make the oxide semiconductor layer intrinsic or substantially intrinsic, in secondary ion mass spectrometry (SIMS), for example, the concentration of silicon at a certain depth of the oxide semiconductor layer or in a region of the oxide semiconductor layer is preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. Further, the concentration of hydrogen at a certain depth of the oxide semiconductor layer or in a region of the oxide semiconductor layer is preferably lower than or equal to $2 \times 10^{20}$ atoms/cm$^3$, further preferably lower than or equal to $5 \times 10^{19}$ atoms/cm$^3$, still further preferably lower than or equal to $1 \times 10^{19}$ atoms/cm$^3$, yet still further preferably lower than or equal to $5 \times 10^{18}$ atoms/cm$^3$. Further, the concentration of nitrogen at a certain depth of the oxide semiconductor layer or in a region of the oxide semiconductor layer is preferably lower than $5 \times 10^{19}$ atoms/cm$^3$, further preferably lower than or equal to $5 \times 10^{18}$ atoms/cm$^3$, still further preferably lower than or equal to $1 \times 10^{18}$ atoms/cm$^3$, yet still further preferably lower than or equal to $5 \times 10^{17}$ atoms/cm$^3$.

In the case where the oxide semiconductor layer includes crystals, high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer may be lower than $1 \times 10^{19}$ atoms/cm$^3$, preferably lower than $5 \times 10^{18}$ atoms/cm$^3$, further preferably lower than $1 \times 10^{18}$ atoms/cm$^3$. Further, the concentration of carbon at a certain depth of the oxide semiconductor layer or in a region of the oxide semiconductor layer may be lower than $1 \times 10^{19}$ atoms/cm$^3$, preferably lower than $5 \times 10^{18}$ atoms/cm$^3$, further preferably lower than $1 \times 10^{18}$ atoms/cm$^3$, for example.

A transistor in which the above-described highly purified oxide semiconductor layer is used for a channel formation region has an extremely low off-state current. In the case where the voltage between a source and a drain is set at about 0.1 V, 5 V, or 10 V, for example, the off-state current standardized on the channel width of the transistor can be as low as several yoctoamperes per micrometer to several zeptoamperes per micrometer.

Next, the band structure of the multilayer semiconductor layer 404 is described. For analyzing the band structure, a stacked film corresponding to the multilayer semiconductor layer 404 is formed. In the stacked film, In—Ga—Zn oxide with an energy gap of 3.5 eV is used for layers corresponding to the oxide semiconductor layer 404a and the oxide semiconductor layer 404c, and In—Ga—Zn oxide with an energy gap of 3.15 eV is used for a layer corresponding to the oxide semiconductor layer 404b.

The thickness of each of the oxide semiconductor layer 404a, the oxide semiconductor layer 404b, and the oxide semiconductor layer 404c was 10 nm. The energy gap was measured with the use of a spectroscopic ellipsometer (UT-300 manufactured by HORIBA Jobin Yvon). Further, the energy difference between the vacuum level and the valence band maximum was measured using an ultraviolet photoelectron spectroscopy (UPS) device (VersaProbe, ULVAC-PHI, Inc.).

Figure 16A:
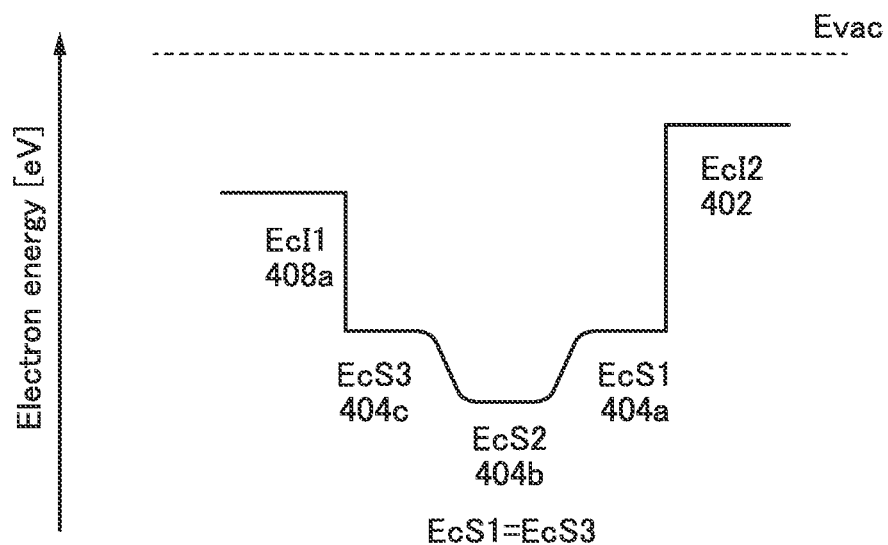
FIGS. 16A and 16B are schematic band diagrams of examples of stacked semiconductor layers.

FIG. 16A is part of a schematic band structure showing an energy difference (electron affinity) between the vacuum level and the conduction band minimum of each layer, which is calculated by subtracting the energy gap from the energy difference between the vacuum level and the valence band maximum. FIG. 16A is a band diagram showing the case where silicon oxide layers are provided in contact with the oxide semiconductor layer 404a and the oxide semiconductor layer 404c. Here, Evac represents energy of the vacuum level, EcI1 represents the conduction band minimum of the gate insulating layer 408 (e.g., hafnium oxide), EcS1 represents the conduction band minimum of the oxide semiconductor layer 404a, EcS2 represents the conduction band minimum of the oxide semiconductor layer 404b, EcS3 represents the conduction band minimum of the oxide semiconductor layer 404c, and EcI2 represents the conduction band minimum of the base insulating layer 402 (e.g., silicon oxide).

As shown in FIG. 16A, the conduction band minimum continuously varies among the oxide semiconductor layer 404a, the oxide semiconductor layer 404b, and the oxide semiconductor layer 404c. This can be understood also from the fact that the constituent elements are common among the oxide semiconductor layer 404a, the oxide semiconductor layer 404b, and the oxide semiconductor layer 404c and oxygen is easily diffused among the oxide semiconductor layers 404a to 404c. Accordingly, the oxide semiconductor layer 404a, the oxide semiconductor layer 404b, and the oxide semiconductor layer 404c have a continuous physical property although they have different compositions in a stack.

The multilayer semiconductor layer 404 in which layers containing the same main components are stacked is formed to have not only a simple stacked-layer structure of the layers but also a continuous energy band (here, in particular, a well structure having a U shape in which the conduction band minimum continuously varies among the layers (U-shape well)). In other words, the stacked-layer structure is formed such that there exist no impurities that form a defect level such as a career trap center or a recombination center at each interface. If impurities exist between the stacked layers in the multilayer semiconductor layer, the continuity of the energy band is lost and carriers at the interface disappear by a trap or recombination.

Note that FIG. 16A shows the case where EcS1 and EcS3 are equal to each other; however, EcS1 and EcS3 may be different from each other. For example, part of the band structure in the case where EcS1 is higher than EcS3 is shown in FIG. 16B.

For example, when EcS1 is equal to EcS3, an In—Ga—Zn oxide whose atomic ratio of In to Ga and Zn is 1:3:2, 1:3:3, 1:3:4, 1:4:4, 1:6:4, or 1:9:6 can be used for the oxide semiconductor layer 404a and the oxide semiconductor layer 404c and an In—Ga—Zn oxide whose atomic ratio of In to Ga and Zn is 1:1:1 or 3:1:2 can be used for the oxide semiconductor layer 404b. Further, when EcS1 is higher than EcS3, an In—Ga—Zn oxide whose atomic ratio of In to Ga and Zn is 1:6:4 or 1:9:6 can be used for the oxide semiconductor layer 404a, an In—Ga—Zn oxide whose atomic ratio of In to Ga and Zn is 1:1:1 or 3:1:2 can be used for the oxide semiconductor layer 404b, and an In—Ga—Zn oxide whose atomic ratio of In to Ga and Zn is 1:3:2, 1:3:3, or 1:3:4 can be used for the oxide semiconductor layer 404c, for example.

Figure 16B:
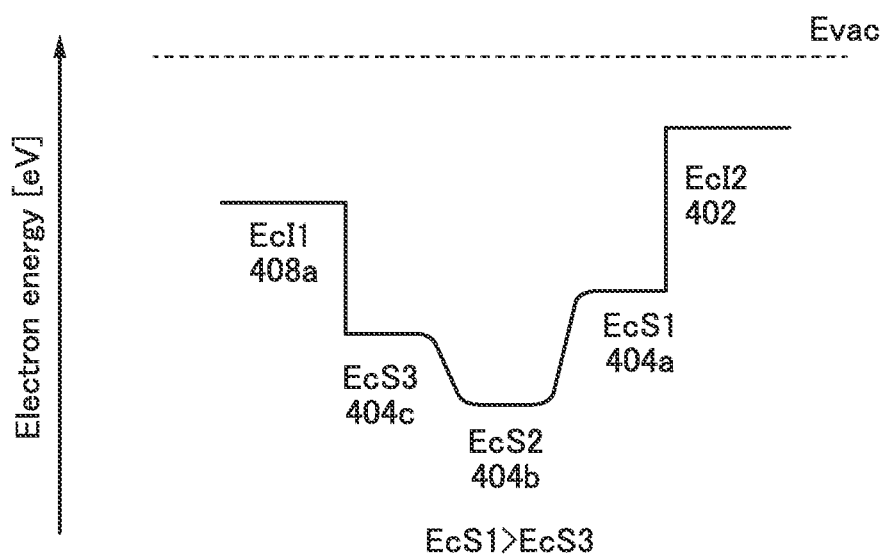

According to FIGS. 16A and 16B, the oxide semiconductor layer 404b of the multilayer semiconductor layer 404 serves as a well, so that a channel is formed in the oxide semiconductor layer 404b in a transistor including the multilayer semiconductor layer 404. Further, a channel formed to have such a structure can also be referred to as a buried channel.

Note that trap states due to impurities or defects might be formed in the vicinity of the interface between the oxide semiconductor layer 404a and an insulating layer having a largely different electron affinity from the oxide semiconductor layer 404a and between the oxide semiconductor layer 404c and an insulating layer having a largely different electron affinity from the oxide semiconductor layer 404c. The oxide semiconductor layer 404b can be distanced away from the trap states owing to existence of the oxide semiconductor layer 404a and the oxide semiconductor layer 404c. However, when the energy differences between EcS2 and EcS1 and between EcS2 and EcS3 are small, an electron in the oxide semiconductor layer 404b might reach the trap states by passing over the energy differences. When the electron is trapped in the trap states, negative fixed charges are generated at the interface with the insulating layers, whereby the threshold of the transistor shifts in the positive direction.

Thus, to reduce a variation in the threshold of the transistor, energy differences between EcS2 and each of EcS1 and EcS3 are necessary. Each of the energy differences is preferably greater than or equal to 0.1 eV, further preferably greater than or equal to 0.15 eV.

The oxide semiconductor layer 404a, the oxide semiconductor layer 404b, and the oxide semiconductor layer 404c preferably include crystal parts. In particular, when a crystal in which c-axes are aligned is used, the transistor can have stable electrical characteristics.

In the case where an In—Ga—Zn oxide is used for the multilayer semiconductor layer 404, it is preferable that the oxide semiconductor layer 404c contain less In than the oxide semiconductor layer 404b so that diffusion of In to the gate insulating layer is prevented.

For the source electrode 406a and the drain electrode 406b, a conductive material that is easily bonded to oxygen is preferably used. For example, Al, Cr, Cu, Ta, Ti, Mo, or W can be used. Among the materials, in particular, it is preferable to use Ti which is easily bonded to oxygen or to use W with a high melting point, which allows subsequent process temperatures to be relatively high. Note that the conductive material that is easily bonded to oxygen includes, in its category, a material to which oxygen is easily diffused.

When the conductive material that is easily bonded to oxygen is in contact with a multilayer semiconductor layer, a phenomenon occurs in which oxygen in the multilayer semiconductor layer is diffused to the conductive material that is easily bonded to oxygen. The phenomenon noticeably occurs when the temperature is high. Since the fabricating process of the transistor involves some heat treatment steps, the above phenomenon causes generation of oxygen vacancies in the vicinity of a region which is in the multilayer semiconductor layer and is in contact with the source electrode or the drain electrode. The oxygen vacancies bond to hydrogen that is slightly contained in the layer, whereby the region is changed to an n-type region. Thus, the n-type region can serve as a source or a drain of the transistor.

In the case of forming a transistor with an extremely short channel length, an n-type region which is formed by the generation of oxygen vacancies might extend in the channel length direction of the transistor, causing a short circuit. In that case, the electrical characteristics of the transistor change; for example, the threshold shifts to cause a state in which on and off states of the transistor cannot be controlled with the gate voltage (conduction state). Accordingly, when a transistor with an extremely short channel length is formed, it is not always preferable that a conductive material that is easily bonded to oxygen be used for a source electrode and a drain electrode.

In such a case, a conductive material which is less likely to be bonded to oxygen than the above material is preferably used for the source electrode 406a and the drain electrode 406b. As the conductive material which is less likely to be bonded to oxygen, for example, a material containing tantalum nitride, titanium nitride, or ruthenium or the like can be used. Note that in the case where the conductive material is in contact with the oxide semiconductor layer 404b, the source electrode 406a and the drain electrode 406b may each have a structure in which the conductive material which is less likely to be bonded to oxygen and the above-described conductive material that is easily bonded to oxygen are stacked.

The base insulating layer 402 can be formed using an insulating layer containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide. The gate insulating layer 408 can be formed using an insulating layer containing one or more of hafnium oxide, aluminum oxide, aluminum silicate, and the like. Note that the thickness of the gate insulating layer is more than or equal to 1 nm and less than or equal to 100 nm, preferably more than or equal to 10 nm and less than or equal to 20 nm.

For the gate electrode 410, a conductive layer formed using Al, Ti, Cr, Co, Ni, Cu, Y, Zr, Mo, Ru, Ag, Ta, W, or the like can be used. The gate electrode may be a stack including any of the above materials. Alternatively, a conductive layer containing nitrogen may be used for the gate electrode 410. For example, the gate electrode 410 can be a stack in which a tungsten layer is formed over a titanium nitride layer, a stack in which a tungsten layer is formed over a tungsten nitride layer, or a stack in which a tungsten layer is formed over a tantalum nitride layer.

The oxide insulating layer 412 may be formed over the gate insulating layer 408 and the gate electrode 410. The oxide insulating layer 412 can be formed using an insulating layer containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide. The oxide insulating layer 412 may be a stack including any of the above materials.

Here, the oxide insulating layer 412 preferably contains excess oxygen. An oxide insulating layer containing excess oxygen refers to an oxide insulating layer from which oxygen can be released by heat treatment or the like. The oxide insulating layer containing excess oxygen is preferably a layer in which the amount of released oxygen when converted into oxygen atoms is $1.0 \times 10^{19}$ atoms/cm$^3$ or more in thermal desorption spectroscopy analysis. Note that the substrate temperature in the thermal desorption spectroscopy analysis is preferably higher than or equal to 100° C. and lower than or equal to 700° C., or higher than or equal to 100° C. and lower than or equal to 500° C. Oxygen released from the oxide insulating layer can be diffused to the channel formation region in the multilayer semiconductor layer 404 through the gate insulating layer 408, so that oxygen vacancies formed in the channel formation region can be filled with the oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. A decrease in channel width causes a reduction in on-state current.

In contrast, in the transistor of one embodiment disclosed in this specification, as described above, the oxide semiconductor layer 404c is formed to cover a channel formation region of the oxide semiconductor layer 404b, so that the channel formation region is not in contact with the gate insulating layer. Accordingly, scattering of carriers at the interface between the channel formation region and the gate insulating layer can be reduced and the on-state current of the transistor can be increased.

When the oxide semiconductor layer is formed to be intrinsic or substantially intrinsic, the field-effect mobility might be reduced because of a decrease in the number of carriers contained in the oxide semiconductor layer. However, in the transistor of one embodiment disclosed in this specification, a gate electric field is applied to the oxide semiconductor layer in the side surface direction in addition to the perpendicular direction. That is, the gate electric field is applied to the whole region of the oxide semiconductor layer, whereby current flows in the bulk of the oxide semiconductor layer. Consequently, a change in the electrical characteristics can be suppressed owing to the highly purified intrinsic oxide semiconductor layer and the field-effect mobility of the transistor can be increased.

In the transistor of one embodiment disclosed in this specification, the oxide semiconductor layer 404b is formed over the oxide semiconductor layer 404a, so that an interface state is less likely to be formed. In addition, impurities do not enter the oxide semiconductor layer 404b from above and below because the oxide semiconductor layer 404b is an intermediate layer in a three-layer structure. With the structure in which the oxide semiconductor layer 404b is surrounded by the oxide semiconductor layer 404a and the oxide semiconductor layer 404c (is electrically covered with the gate electrode 410), on-state current of the transistor is increased as described above, and in addition, threshold voltage can be stabilized and an S value can be reduced. Thus, Icut can be reduced and power consumption can be reduced. Further, the threshold of the transistor becomes stable; thus, long-term reliability of the semiconductor device can be improved.

Figure 17A:
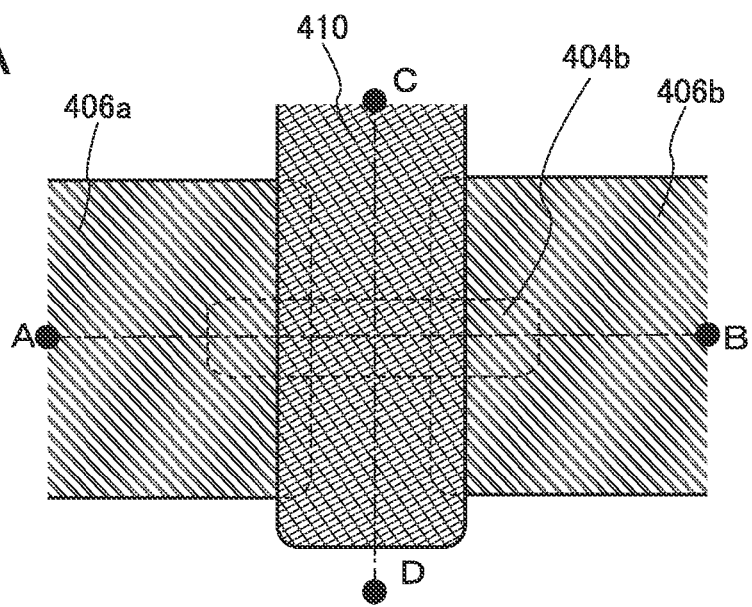
FIGS. 17A to 17C are a top view and cross-sectional views of an example of a transistor.
Figure 17B:
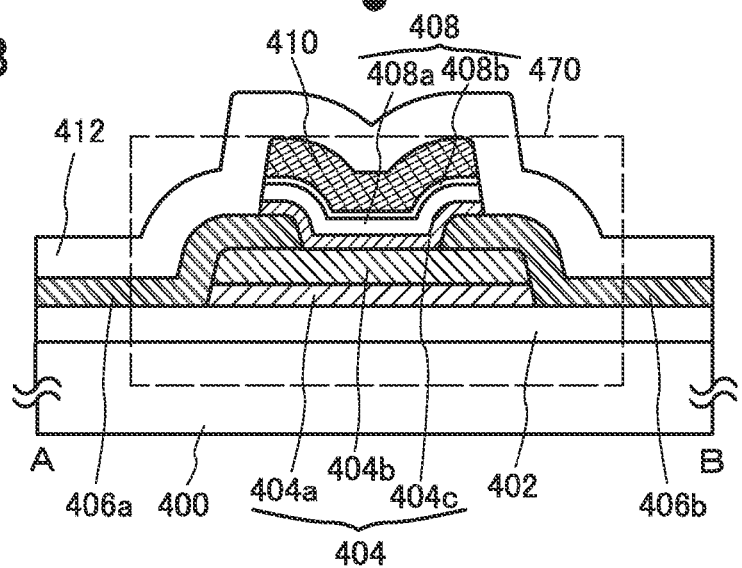
Figure 17C:
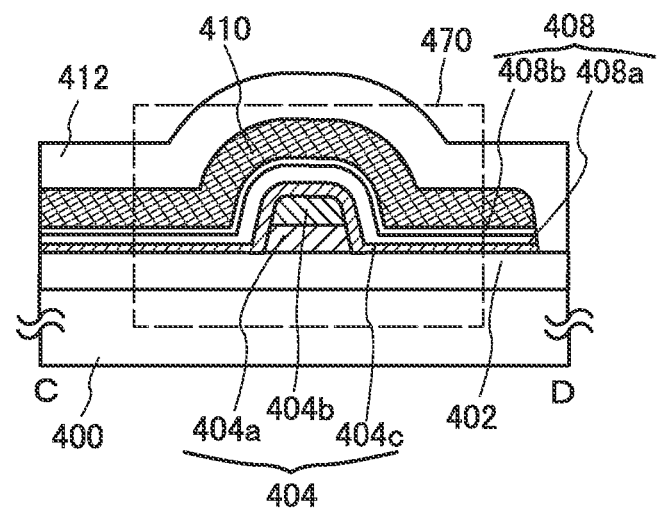

A transistor 470 illustrated in FIGS. 17A to 17C can be used. FIGS. 17A to 17C are a top view and cross-sectional views of the transistor 470. FIG. 17A is the top view. FIG. 17B illustrates a cross section taken along the dashed-dotted line A-B in FIG. 17A. FIG. 17C illustrates a cross section taken along the dashed-dotted line C-D in FIG. 17A. Note that for simplification of the drawing, some components are not illustrated in the top view in FIG. 17A.

In the transistor 470, the base insulating layer 402 is not etched substantially when the source electrode 406a and the drain electrode 406b are formed.

To prevent the base insulating layer 402 from being etched substantially, the etching rate of the base insulating layer 402 is preferably set sufficiently lower than the etching rate of a conductive layer to be processed into the source electrode 406a and the drain electrode 406b.

In this embodiment, although the oxide semiconductor layer 404b is sandwiched between the oxide semiconductor layer 404a and the oxide semiconductor layer 404c, without limited to this structure, one embodiment of the present invention may have a structure in which only the oxide semiconductor layer 404b is provided without the oxide semiconductor layer 404a and the oxide semiconductor layer 404c and is electrically covered with the gate electrode.

This embodiment can be implemented in combination with any of the other embodiments disclosed in this specification as appropriate.

Embodiment 3

In this embodiment, a method for forming the transistor 450, which is described in Embodiment 2 with reference to FIGS. 15A to 15C, is described with reference to FIGS. 18A to 18C and FIGS. 19A to 19C.

Figure 18A:
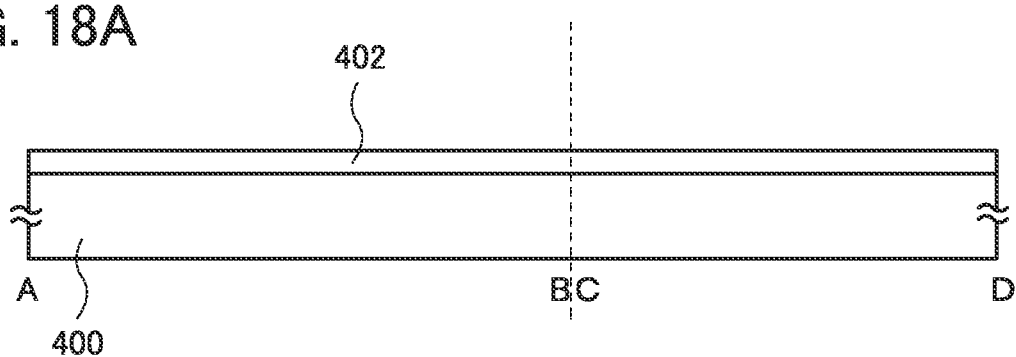
FIGS. 18A to 18C illustrate a method for manufacturing the example of a transistor.

First, the base insulating layer 402 is formed over the substrate 400 (see FIG. 18A).

For the substrate 400, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Any of these substrates further provided with a semiconductor element thereover may be used.

Oxygen may be added to the base insulating layer 402 by an ion implantation method, an ion doping method, a plasma immersion ion implantation method, or the like. Addition of oxygen enables the base insulating layer 402 to supply oxygen much easily to the multilayer semiconductor layer 404.

Figure 18B:
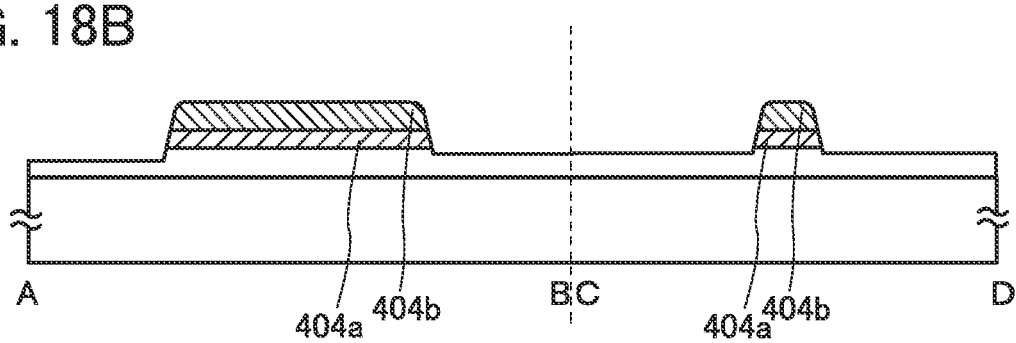

Next, the oxide semiconductor layer 404a and the oxide semiconductor layer 404b are formed over the base insulating layer 402 by a sputtering method; a chemical vapor deposition (CVD) method such as a metal organic chemical vapor deposition (MOCVD) method, an atomic layer deposition (ALD) method, or a plasma-enhanced CVD (PECVD) method; a vacuum evaporation method; or a pulse laser deposition (PLD) method (see FIG. 18B). At this time, as illustrated, the base insulating layer 402 may be slightly over-etched. By over-etching of the base insulating layer 402, the gate electrode 410 to be formed later can cover the oxide semiconductor layer 404c easily.

For processing the oxide semiconductor layer 404a and the oxide semiconductor layer 404b into island shapes, a layer to be a hard mask (e.g., a tungsten layer) and a resist mask are provided over the oxide semiconductor layer 404b, and the layer to be a hard mask is etched to form a hard mask. The resist mask is removed and then the oxide semiconductor layer 404a and the oxide semiconductor layer 404b are etched using the hard mask as a mask. Then, the hard mask is removed. At this step, the hard mask is gradually reduced as the etching progresses; as a result, the edges of the hard mask is rounded to have a curved surface. Accordingly, the edges of the oxide semiconductor layer 404b is rounded to have a curved surface. This structure improves the coverage with the oxide semiconductor layer 404c, the gate insulating layer 408, the gate electrode 410, and the oxide insulating layer 412, which are to be formed over the oxide semiconductor layer 404b, and can prevent shape defects such as disconnection. In addition, electric field concentration which might occur at end portions of the source electrode 406a and the drain electrode 406b can be reduced, which can reduce deterioration of the transistor.

In order to form a continuous junction in stacked layers including the oxide semiconductor layers 404a and 404b, or stacked layers also including the oxide semiconductor layer 404c to be formed in a later step, the layers need to be formed successively without exposure to the air with the use of a multi-chamber deposition apparatus (e.g., a sputtering apparatus) including a load lock chamber. It is preferable that each chamber of the sputtering apparatus be able to be evacuated to a high vacuum (to about $5\times10^{-7}$ Pa to $1\times10^{-4}$ Pa) by an adsorption vacuum pump such as a cryopump and that the chamber be able to heat a substrate to 100° C. or higher, preferably 500° C. or higher so that water and the like acting as impurities for the oxide semiconductor can be removed as much as possible. Alternatively, a combination of a turbo molecular pump and a cold trap is preferably used to prevent back-flow of a gas containing a carbon component, moisture, or the like from an exhaust system into the chamber.

Not only high vacuum evacuation in a chamber but also increasing the purity of a sputtering gas is necessary to obtain a high-purity intrinsic oxide semiconductor. As an oxygen gas or an argon gas used for a sputtering gas, a gas which is highly purified to have a dew point of −40° C. or lower, preferably −80° C. or lower, further preferably −100° C. or lower is used, whereby entry of moisture or the like into the oxide semiconductor layer can be prevented as much as possible.

The materials described in Embodiment 2 can be used for the oxide semiconductor layer 404a, the oxide semiconductor layer 404b, and the oxide semiconductor layer 404c that is to be formed in a later step. For example, an In—Ga—Zn oxide whose atomic ratio of In to Ga and Zn is 1:3:4 or 1:3:2 can be used for the oxide semiconductor layer 404a, an In—Ga—Zn oxide whose atomic ratio of In to Ga and Zn is 1:1:1 can be used for the oxide semiconductor layer 404b, and an In—Ga—Zn oxide whose atomic ratio of In to Ga and Zn is 1:3:4 or 1:3:2 can be used for the oxide semiconductor layer 404c.

An oxide that can be used for each of the oxide semiconductor layers 404a, 404b, and 404c preferably contains at least indium (In) or zinc (Zn). Both In and Zn are preferably contained. Furthermore, in order to reduce variations in electrical characteristics of the transistors including the oxide, the oxide preferably contains a stabilizer in addition to In and Zn.

As a stabilizer, gallium (Ga), tin (Sn), hafnium (Hf), aluminum (Al), zirconium (Zr), and the like are used. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, In—Zn oxide, Sn—Zn oxide, Al—Zn oxide, Zn—Mg oxide, Sn—Mg oxide, In—Mg oxide, In—Ga oxide, In—Ga—Zn oxide, In—Al—Zn oxide, In—Sn—Zn oxide, Sn—Ga—Zn oxide, Al—Ga—Zn oxide, Sn—Al—Zn oxide, In—Hf—Zn oxide, In—La—Zn oxide, In—Ce—Zn oxide, In—Pr—Zn oxide, In—Nd—Zn oxide, In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide, In—Lu—Zn oxide, In—Sn—Ga—Zn oxide, In—Hf—Ga—Zn oxide, In—Al—Ga—Zn oxide, In—Sn—Al—Zn oxide, In—Sn—Hf—Zn oxide, or In—Hf—Al—Zn oxide.

For example, "In—Ga—Zn oxide" means an oxide containing In, Ga, and Zn as its main components. The In—Ga—Zn oxide may contain another metal element in addition to In, Ga, and Zn. Note that in this specification, a layer containing the In—Ga—Zn oxide is also referred to as an IGZO layer.

A material represented by $InMO_3(ZnO)_m$ (m>0 is satisfied, and m is not an integer) may be used. Note that M represents one or more metal elements selected from Ga, Fe, Mn, or Co. A material represented by $In_2SnO_5(ZnO)_n$ (n>0, n is an integer) may be used.

Note that as described in Embodiment 2 in detail, materials are selected so that the oxide semiconductor layers 404a and 404c each have an electron affinity lower than that of the oxide semiconductor layer 404b.

Note that the oxide semiconductor layer is preferably formed by a sputtering method. As a sputtering method, an RF sputtering method, a DC sputtering method, an AC sputtering method, or the like can be used. In particular, a DC sputtering method is preferably used because dust generated in the film formation can be reduced and the thickness can be uniform.

When In—Ga—Zn oxide is used for the oxide semiconductor layers 404a, 404b, and 404c, a material whose atomic ratio of In to Ga and Zn is any of 1:1:1, 2:2:1, 3:1:2, 1:3:2, 1:3:4, 1:4:3, 1:5:4, 1:6:6, 2:1:3 1:6:4, 1:9:6, 1:1:4, and 1:1:2 is used so that the oxide semiconductor layers 404a and 404c each have an electron affinity lower than that of the oxide semiconductor layer 404b.

Note that the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio. In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The indium content in the oxide semiconductor layer 404b is preferably higher than those in the oxide semiconductor layers 404a and 404c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. Thus, with use of an oxide having a high indium content for the oxide semiconductor layer 404b, a transistor having high mobility can be achieved.

Here, a structure of an oxide semiconductor layer will be described.

In this specification, a term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

An oxide semiconductor layer is classified roughly into a non-single-crystal oxide semiconductor layer and a single crystal oxide semiconductor layer. The non-single-crystal oxide semiconductor layer includes any of a c-axis aligned crystalline oxide semiconductor (CAAC-OS) layer, a polycrystalline oxide semiconductor layer, a microcrystalline oxide semiconductor layer, an amorphous oxide semiconductor layer, and the like.

First of all, a CAAC-OS layer is described.

The CAAC-OS layer is an oxide semiconductor layer including a plurality of crystal parts. Most of the crystal parts each fit inside a cube whose one side is less than 100 nm. Thus, the CAAC-OS layer may include a crystal part that fits inside a cube whose one side is less than 10 nm, less than 5 nm, or less than 3 nm.

In a transmission electron microscope (TEM) image of the CAAC-OS layer, a boundary between crystal parts, that is, a grain boundary is not clearly observed. Thus, in the CAAC-OS layer, a reduction in electron mobility due to the grain boundary is unlikely to occur.

In the TEM image of the CAAC-OS layer observed in a direction substantially parallel to a sample surface (cross-sectional TEM image), metal atoms are arranged in a layered manner in the crystal parts. Each metal atom layer has a morphology reflecting a surface over which the CAAC-OS layer is formed (hereinafter, a surface over which the CAAC-OS layer is formed is referred to as a formation surface) or a top surface of the CAAC-OS layer, and is arranged parallel to the formation surface or the top surface of the CAAC-OS layer.

In the TEM image of the CAAC-OS layer observed in a direction substantially perpendicular to the sample surface (plan TEM image), metal atoms are arranged in a triangular or hexagonal configuration in the crystal parts. However, there is no regularity in arrangement of metal atoms between different crystal parts.

From the cross-sectional TEM image and the plan TEM image, orientation characteristics are found in the crystal parts in the CAAC-OS layer.

A CAAC-OS layer is subjected to structural analysis with an X-ray diffraction (XRD) apparatus. For example, when the CAAC-OS layer including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS layer have c-axis alignment, and that the c-axes are aligned in a direction substantially perpendicular to the formation surface or the top surface of the CAAC-OS layer.

When the CAAC-OS layer is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Analysis (Φ scan) is performed under conditions where the sample is rotated around a normal vector of the sample surface as an axis (Φ axis) with 2θ fixed at around 56°. When the sample is a single-crystal oxide semiconductor layer of InGaZnO$_4$, six peaks appear. The six peaks are derived from crystal planes equivalent to the (110) plane. In contrast, when the sample is the CAAC-OS layer, a peak is not clearly observed.

The above results mean that in the CAAC-OS layer having c-axis alignment, the directions of a-axes and b-axes are different between crystal parts, but the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS layer or is formed through crystallization treatment such as heat treatment. As described above, the c-axis of the crystal is oriented in a direction parallel to a normal vector of a formation surface or a normal vector of a top surface. Thus, for example, when the shape of the CAAC-OS layer is changed by etching or the like, the c-axis might not be necessarily parallel to a normal vector of a formation surface or a normal vector of a top surface of the CAAC-OS layer.

Furthermore, the degree of crystallinity in the CAAC-OS layer is not necessarily uniform. For example, if crystal growth leading to the CAAC-OS layer occurs from the vicinity of the top surface of the layer, the degree of the crystallinity in the vicinity of the top surface may be higher than that in the vicinity of the formation surface. Moreover, when an impurity is added to the CAAC-OS layer, the crystallinity in a region to which the impurity is added is changed, and the degree of crystallinity in the CAAC-OS layer varies depending on regions.

Note that when the CAAC-OS layer with an InGaZnO$_4$ crystal is analyzed by an out-of-plane method, a peak of 2θ may be observed at around 36°, in addition to the peak of 2θ at around 31°. The peak of 2θ at around 36° indicates that a crystal having no c-axis alignment is included in part of the CAAC-OS layer. It is preferable that a peak of 2θ appears at around 31° and a peak of 2θ does not appear at around 36°.

The CAAC-OS layer is an oxide semiconductor layer having low impurity concentration. The impurity is an element other than the main components of the oxide semiconductor layer, such as hydrogen, carbon, silicon, or a transition metal element. In particular, an element that has higher bonding strength to oxygen than a metal element included in the oxide semiconductor layer, such as silicon, disturbs the atomic arrangement of the oxide semiconductor layer by depriving the oxide semiconductor layer of oxygen and causes a decrease in crystallinity. A heavy metal such as iron or nickel, argon, carbon dioxide, or the like has a large atomic radius (molecular radius), and thus disturbs the atomic arrangement of the oxide semiconductor layer and causes a decrease in crystallinity if contained in the oxide semiconductor layer. Note that the impurity contained in the oxide semiconductor layer might serve as a carrier trap center or a carrier generation source.

The CAAC-OS layer is an oxide semiconductor layer having a low density of defect states. Oxygen vacancies in the oxide semiconductor layer may serve as carrier trap centers or carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor layer has few carrier generation sources, and thus can have a low carrier density. Thus, a transistor including the oxide semiconductor layer rarely has negative threshold (is rarely normally on). The highly purified intrinsic or substantially highly purified intrinsic oxide semiconductor layer has few carrier trap centers. Accordingly, the transistor including the oxide semiconductor layer has little variation in electrical characteristics and high reliability. Electric charge trapped by the carrier trap centers in the oxide semiconductor layer takes a long time to be released, and thus may behave like fixed electric charge. Accordingly, the transistor which includes the oxide semiconductor layer having high impurity concentration and a high density of defect states can have unstable electrical characteristics.

In a transistor using the CAAC-OS layer, change in electrical characteristics due to irradiation with visible light or ultraviolet light is small.

Next, a microcrystalline oxide semiconductor layer will be described.

In a TEM image, crystal parts cannot be found clearly in the microcrystalline oxide semiconductor layer in some cases. In most cases, the size of a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor layer including nanocrystal is referred to as an nc-OS (nanocrystalline oxide semiconductor) layer. In a TEM image of the nc-OS layer, for example, a crystal grain boundary cannot clearly found in some cases.

In the nc-OS layer, a microscopic region (for example, a region with a size greater than or equal to 1 nm and less than or equal to 10 nm, in particular, a region with a size greater than or equal to 1 nm and less than or equal to 3 nm) has a periodic atomic order. There is no regularity of crystal orientation between different crystal parts in the nc-OS layer. Thus, the orientation of the whole layer is not observed. Accordingly, the nc-OS layer sometimes cannot be distinguished from an amorphous oxide semiconductor layer depending on an analysis method. For example, when the nc-OS layer is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS layer obtained by using an electron beam having a probe diameter (e.g., greater than or equal to 50 nm) larger than the diameter of a crystal part. Meanwhile, spots are shown in a nanobeam electron diffraction pattern of the nc-OS layer obtained by using an electron beam having a probe diameter (e.g., greater than or equal to 1 nm and smaller than or equal to 30 nm) close to, or smaller than or equal to a diameter of a crystal part. In a nanobeam electron diffraction pattern of the nc-OS layer, regions with high luminance in a circular (ring) pattern may be shown, and a plurality of spots may be shown in the ring-like region.

The nc-OS layer is an oxide semiconductor layer that has high regularity as compared with an amorphous oxide semiconductor layer. For this reason, the nc-OS layer has a lower density of defect states than an amorphous oxide semiconductor layer. However, there is no regularity of crystal orientation between different crystal parts in the nc-OS layer; hence, the nc-OS layer has a higher density of defect states than the CAAC-OS layer.

Note that an oxide semiconductor layer may be a stacked layer including two or more layers of an amorphous oxide semiconductor layer, a microcrystalline oxide semiconductor layer, and a CAAC-OS layer, for example.

For example, the CAAC-OS layer can be deposited by a sputtering method using a polycrystalline oxide semiconductor sputtering target. When ions collide with the sputtering target, a crystal region included in the sputtering target is sometimes separated from the target along an a-b plane; in other words, a sputtered particle having a plane parallel to an a-b plane (flat-plate-like sputtered particle or pellet-like sputtered particle) flakes off from the sputtering target. The sputtered particle is electrically charged and thus reaches the substrate while maintaining its crystal state, without being aggregation in plasma, forming a CAAC-OS layer.

First heat treatment may be performed after the oxide semiconductor layer 404b is formed. The first heat treatment may be performed at a temperature higher than or equal to 250° C. and lower than or equal to 650° C., typically higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor layer 404b can be improved, and in addition, impurities such as hydrogen and water can be removed from the base insulating layer 402 and the oxide semiconductor layer 404a. Note that the first heat treatment may be performed before etching for formation of the oxide semiconductor layer 404b.

A first conductive layer to be the source electrode 406a and the drain electrode 406b is formed over the oxide semiconductor layers 404a and 404b. For the first conductive layer, Al, Cr, Cu, Ta, Ti, Mo, W, or an alloy material containing any of these as a main component can be used. For example, a 100-nm-thick titanium layer is formed by a sputtering method or the like. Alternatively, a tungsten layer may be formed by a CVD method.

Figure 18C:
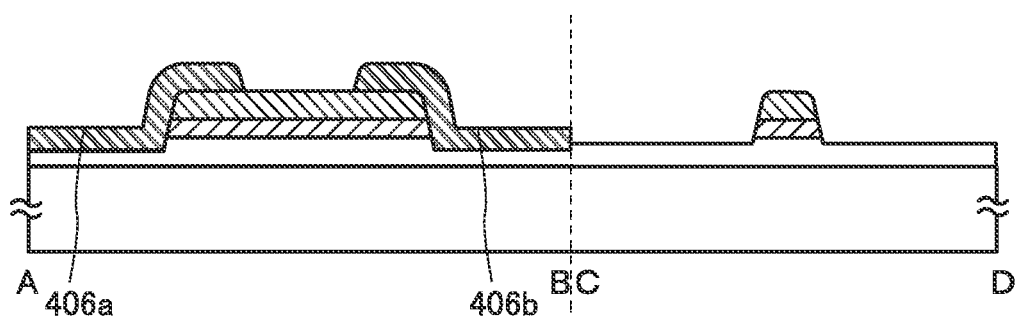

Then, the first conductive layer is etched so as to be divided over the oxide semiconductor layer 404b, so that the source electrode 406a and the drain electrode 406b are formed (see FIG. 18C).

Next, the oxide semiconductor layer 403c is formed over the oxide semiconductor layer 404b, the source electrode 406a, and the drain electrode 406b.

Note that second heat treatment may be performed after the oxide semiconductor layer 403c is formed. The second heat treatment can be performed under conditions similar to those of the first heat treatment. The second heat treatment can remove impurities such as hydrogen and water from the oxide semiconductor layer 403c. In addition, impurities such as hydrogen and water can be further removed from the oxide semiconductor layer 404a and 404b.

Figure 19A:
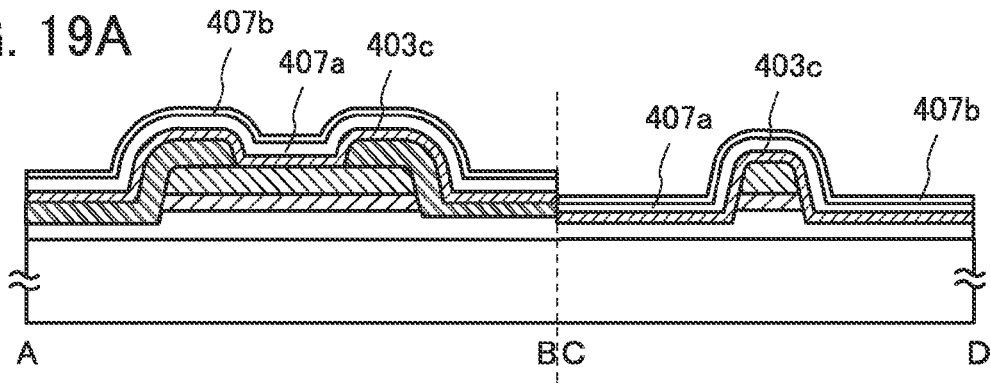
FIGS. 19A to 19C illustrate a method for manufacturing the example of a transistor.

Next, an insulating layer 407a and an insulating layer 407b are formed over the oxide semiconductor layer 403c (see FIG. 19A). For example, the insulating layer 407a is formed by a CVD method, and the insulating layer 407b is formed by a sputtering method. However, the formation methods are not limited to this combination and may be selected from a sputtering method, a CVD method, a vacuum evaporation method, a PLD method, and the like.

Figure 19B:
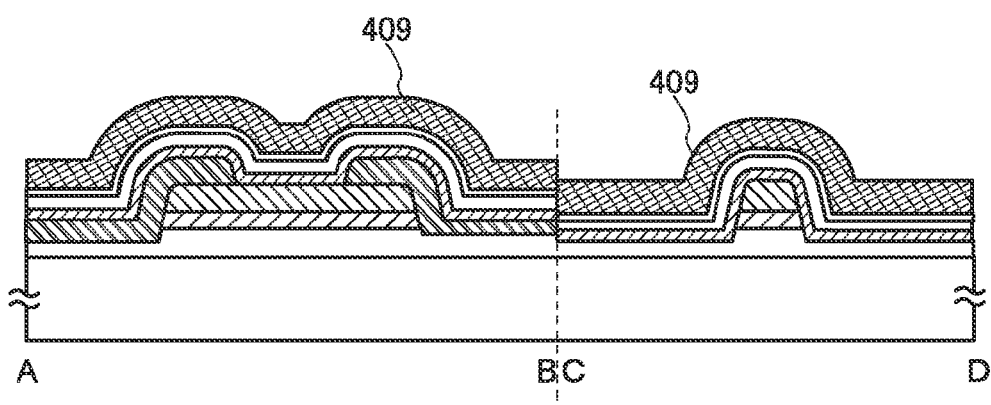

Then, a second conductive layer 409 to be the gate electrode 410 is formed over the insulating layer 407b (see FIG. 19B). For the second conductive layer 409, Al, Ti, Cr, Co, Ni, Cu, Y, Zr, Mo, Ru, Ag, Ta, W, or an alloy material containing any of these as its main component can be used. The second conductive layer 409 can be formed by a sputtering method, a CVD method, or the like. A stack including a conductive layer containing any of the above materials and a conductive layer containing nitrogen, or a conductive layer containing nitrogen may be used for the second conductive layer 409.

Figure 19C:
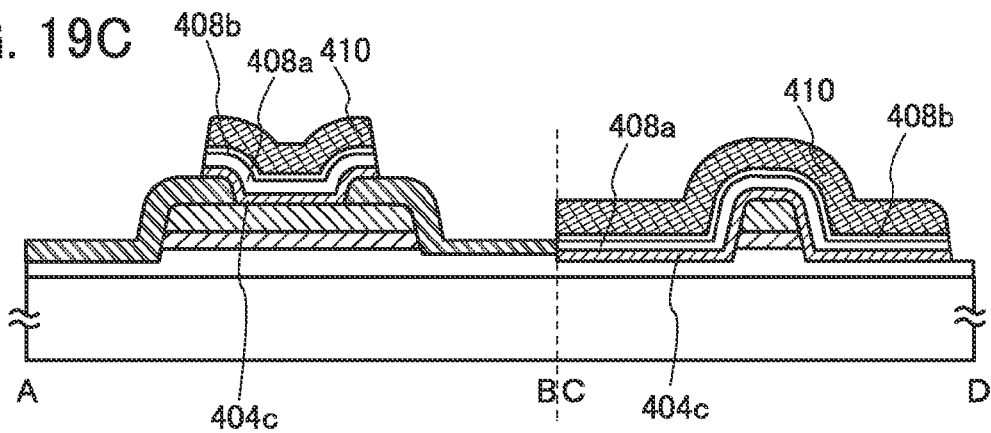

Next, the second conductive layer 409 is selectively etched using a resist mask to form the gate electrode 410 (see FIG. 19C). Note that as shown in FIG. 15C, the oxide semiconductor layer 404b is surrounded by the gate electrode 410.

Then, the insulating layer 407a and the insulating layer 407b are selectively etched using the resist mask or the gate electrode 410 as a mask to form the first insulating layer 408a and the second insulating layer 408b (these are collectively referred to as the gate insulating layer 408).

Then, the oxide semiconductor layer 403c is etched using the resist mask or the gate electrode 410 as a mask to form the oxide semiconductor layer 404c.

The upper edge of the oxide semiconductor layer 404c is aligned with the bottom edge of the gate insulating layer 408. The upper edge of the gate insulating layer 408 is aligned with the bottom edge of the gate electrode 410. Although the gate insulating layer 408 and the oxide semiconductor layer 404c are formed using the gate electrode 410 as a mask, the gate insulating layer 408 and the oxide semiconductor layer 404c may be formed before the second conductive layer 409 is formed.

Next, the oxide insulating layer 412 is formed over the source electrode 406a, the drain electrode 406b, and the gate electrode 410 (see FIGS. 15B and 15C). A material and a method for the oxide insulating layer 412 can be similar to those for the base insulating layer 402. The oxide insulating layer 412 may be using an aluminum oxide, a magnesium oxide, a silicon oxide, a silicon oxynitride, a silicon nitride oxide, a silicon nitride, a gallium oxide, a germanium oxide, an yttrium oxide, a zirconium oxide, a lanthanum oxide, a neodymium oxide, a hafnium oxide, a tantalum oxide, or any of the above oxides containing nitrogen. The oxide insulating layer 412 can be formed by a sputtering method, a CVD method such as a MOCVD method, an ALD method, or a PECVD method, a vacuum evaporation method, or a PLD method. The oxide insulating layer 412 preferably contains excessive oxygen so as to be able to supply oxygen to the multilayer semiconductor layer 404.

Next, third heat treatment may be performed. The third heat treatment can be performed under conditions similar to those of the first heat treatment. By the third heat treatment, excess oxygen is easily released from the base insulating layer 402, the gate insulating layer 408, and the oxide insulating layer 412, so that oxygen vacancies in the multilayer layer 404 can be reduced.

Next, fourth heat treatment is performed. In the fourth heat treatment, the potential of the gate electrode 410 is kept higher than that of the source or drain electrode at a high temperature higher than or equal to 125° C. and lower than or equal to 450° C., preferably higher than or equal to 150° C. and lower than or equal to 300° C. for one second or longer, typically 1 minute or longer. As a result, a necessary number of electrons moves from the multilayer semiconductor layer 404 toward the gate electrode 410 and some of them are trapped by the charge trap states existing inside the gate insulating layer 408. By controlling the number of trapped electrons, the increase of threshold can be controlled.

Through the above process, the transistor 450 illustrated in FIGS. 15A to 15C can be fabricated.

This embodiment can be implemented in combination with any of the other embodiments disclosed in this specification as appropriate.

Embodiment 4

In this embodiment, a planar transistor will be described.

Figure 20A:
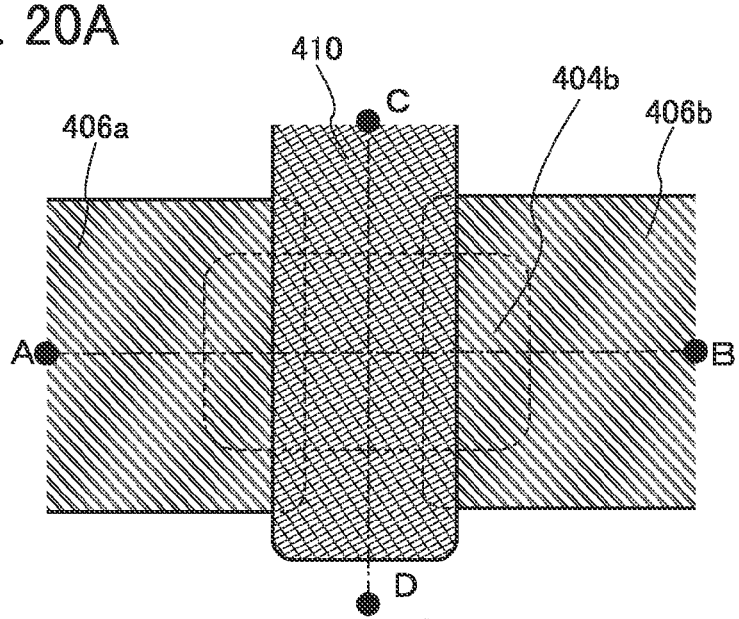
FIGS. 20A to 20C are a top view and cross-sectional views of an example of a transistor.
Figure 20B:
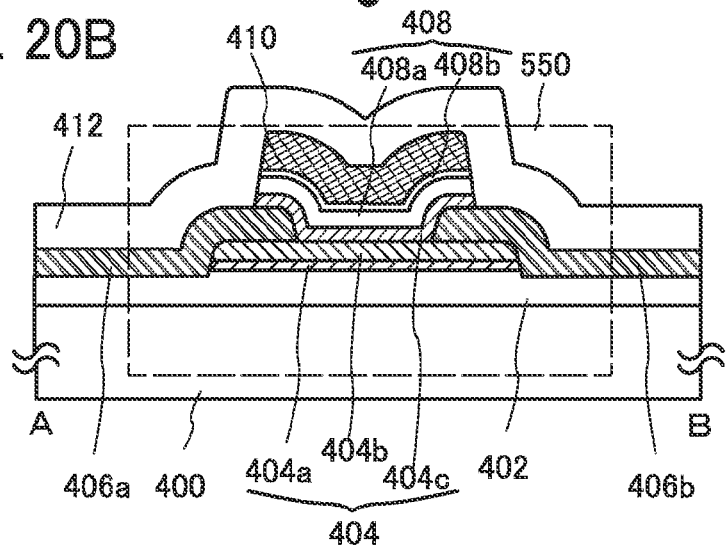
Figure 20C:
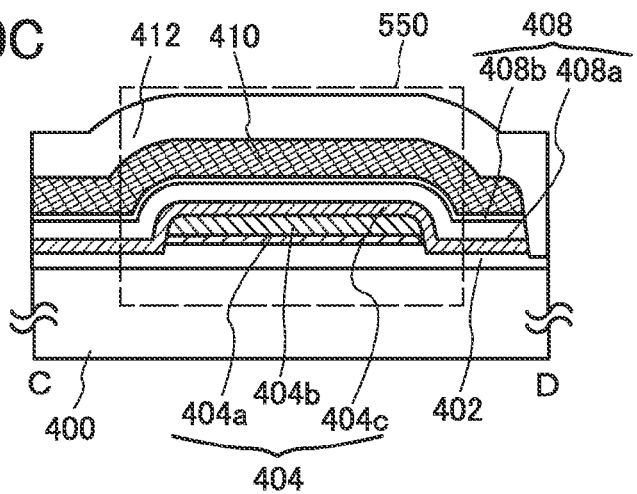

FIGS. 20A to 20C are a top view and cross-sectional views illustrating a transistor of one embodiment disclosed in this specification. FIG. 20A is the top view, FIG. 20B illustrates a cross section taken along the dashed-dotted line A-B in FIG. 20A, and FIG. 20C illustrates a cross section taken along the dashed-dotted line C-D in FIG. 20A. Note that for drawing simplicity, some components are not illustrated in the top view of FIG. 20A. In some cases, the direction of the dashed-dotted line A-B is referred to as a channel length direction, and the direction of the dashed-dotted line C-D is referred to as a channel width direction.

A transistor 550 illustrated in FIGS. 20A to 20C includes a base insulating layer 402 over a substrate 400, an oxide semiconductor layer 404a and an oxide semiconductor layer 404b over the base insulating layer 402, a source electrode 406a and a drain electrode 406b over the oxide semiconductor layer 404a and the oxide semiconductor layer 404b, an oxide semiconductor layer 404c that is in contact with the base insulating layer 402, the oxide semiconductor layer 404a, the oxide semiconductor layer 404b, the source electrode 406a, and the drain electrode 406b, a gate insulating layer 408 over the oxide semiconductor layer 404c, a gate electrode 410 over the gate insulating layer 408, and an oxide insulating layer 412 over the source electrode 406a, the drain electrode 406b, and the gate electrode 410. The gate insulating layer 408 functions as the charge trap layer described in Embodiment 1. The oxide semiconductor layer 404a, the oxide semiconductor layer 404b, and the oxide semiconductor layer 404c are collectively referred to as a multilayer semiconductor layer 404.

The transistor 550 of this embodiment is different from the transistor 450 of Embodiment 2 in having a channel length and a channel width that are more than or equal to twice, typically more than or equal to ten times the thickness of the multilayer semiconductor layer 404.

Note that the channel length refers to the distance between a source (a source region, source electrode) and a drain (drain region, drain electrode) in a region where a semiconductor layer overlaps with a gate electrode in the top view. That is, the channel length in FIG. 20A is the distance between the source electrode 406a and the drain electrode 406b in the region where the oxide semiconductor layer 404b overlaps with the gate electrode 410. The channel width refers to the width of a source or a drain in a region where a semiconductor layer overlaps with a gate electrode.

That is, the channel length in FIG. 20A is the width of the source electrode 406a or the drain electrode 406b in the region where the semiconductor layer 404b overlaps with the gate electrode 410.

In this embodiment, although the oxide semiconductor layer 404b is sandwiched between the oxide semiconductor layer 404a and the oxide semiconductor layer 404c, without limited to this structure, one embodiment of the present invention may have a structure in which only the oxide semiconductor layer 404b is provided without the oxide semiconductor layer 404a and the oxide semiconductor layer 404c. Alternatively, one embodiment of the present invention may have a structure in which any one or two of the oxide semiconductor layer 404a, the oxide semiconductor layer 404b, and the oxide semiconductor layer 404c is/are provided.

This embodiment can be implemented in combination with any of the other embodiments disclosed in this specification as appropriate.

Embodiment 5

The semiconductor device of one embodiment disclosed in this specification can be used for display devices, personal computers, image reproducing devices provided with recording media (typically, devices that reproduce the content of recording media such as digital versatile discs (DVDs) and have displays for displaying the reproduced images), or the like. Other examples of electronic devices that can be equipped with the semiconductor device of one embodiment disclosed in this specification are mobile phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 21A to 21F illustrate specific examples of these electronic devices.

FIG. 21A illustrates a portable game machine including a housing 501, a housing 502, a display portion 503, a display portion 504, a microphone 505, a speaker 506, an operation key 507, a stylus 508, and the like. Although the portable game machine in FIG. 21A has the two display portions 503 and 504, the number of display portions included in a portable game machine is not limited to this.

FIG. 21B illustrates a portable data terminal including a first housing 511, a second housing 512, a first display portion 513, a second display portion 514, a joint 515, an operation key 516, and the like. The first display portion 513 is provided in the first housing 511, and the second display portion 514 is provided in the second housing 512. The first housing 511 and the second housing 512 are connected to each other with the joint 515, and the angle between the first housing 511 and the second housing 512 can be changed with the joint 515. An image on the first display portion 513 may be switched depending on the angle between the first housing 511 and the second housing 512 at the joint 515. A display device with a position input function may be used as at least one of the first display portion 513 and the second display portion 514. Note that the position input function can be added by providing a touch panel in a display device. Alternatively, the position input function can be added by provision of a photoelectric conversion element called a photosensor in a pixel area of a display device.

FIG. 21C illustrates a laptop personal computer, which includes a housing 521, a display portion 522, a keyboard 523, a pointing device 524, and the like.

FIG. 21D illustrates the electric refrigerator-freezer including a housing 531, a door for a refrigerator 532, a door for a freezer 533, and the like.

FIG. 21E illustrates a video camera, which includes a first housing 541, a second housing 542, a display portion 543, operation keys 544, a lens 545, a joint 546, and the like. The operation keys 544 and the lens 545 are provided for the first housing 541, and the display portion 543 is provided for the second housing 542. The first housing 541 and the second housing 542 are connected to each other with the joint 546, and the angle between the first housing 541 and the second housing 542 can be changed with the joint 546. Images displayed on the display portion 543 may be switched in accordance with the angle at the joint 546 between the first housing 541 and the second housing 542.

FIG. 21F illustrates a passenger car including a car body 551, wheels 552, a dashboard 553, lights 554, and the like.

This embodiment can be implemented in combination with any of the other embodiments disclosed in this specification as appropriate.

This application is based on Japanese Patent Application serial no. 2013-174405 filed with Japan Patent Office on Aug. 26, 2013, the entire contents of which are hereby incorporated by reference.

What is claimed is:

1. A semiconductor device comprising:
 a plurality of transistors each comprising:
  a first semiconductor;
  an electrode electrically connected to the first semiconductor;
  a gate electrode; and
  a charge trap layer between the gate electrode and the first semiconductor;
 a first circuit configured to supply a signal to the gate electrodes of the plurality of transistors; and
 a second circuit configured to supply a signal to the electrodes of the plurality of transistors,
 wherein the first circuit includes a decoder and a selection circuit,
 wherein a signal output from the decoder and a first signal are input to the selection circuit,
 wherein second signals are output from the selection circuit to the gate electrodes of the plurality of the transistors for shifting thresholds of the plurality of transistors when the first signal is high, and
 wherein the selection circuit performs an XOR operation.

2. The semiconductor device according to claim 1, wherein the charge trap layer includes charge trap states.

3. The semiconductor device according to claim 1, wherein the charge trap layer comprises any one of silicon nitride, hafnium oxide, aluminum oxide, and aluminum silicate.

4. The semiconductor device according to claim 1, wherein the electrode is a source electrode or a drain electrode.

5. The semiconductor device according to claim 1, wherein each of the plurality of transistors, further comprises a second semiconductor and a third semiconductor,
 wherein the first semiconductor is between the second semiconductor and the third semiconductor, and
 wherein the second semiconductor is between the first semiconductor and the charge trap layer.

6. The semiconductor device according to claim 1, wherein a potential applied to the gate electrode is lower than a highest potential that is used in the semiconductor device.

7. A method for manufacturing the semiconductor device according to claim 1,
wherein thresholds of the plurality of transistors are increased by performing heat treatment at a temperature higher than or equal to 125° C. and lower than or equal to 450° C., and at the same time, keeping a potential of the gate electrode higher than a potential of the electrode by the first signal for 1 second or more.

8. The semiconductor device according to claim 1, further comprising:
a third circuit configured to supply the first signal to the selection circuit.

9. A semiconductor device comprising:
a plurality of transistors each comprising:
an first semiconductor;
an electrode electrically connected to the first semiconductor;
a gate electrode; and
a charge trap layer between the gate electrode and the first semiconductor;
a first circuit configured to supply a signal to the gate electrodes of the plurality of transistors;
a second circuit configured to supply a signal to the electrodes of the plurality of transistors,
wherein the first circuit includes a decoder and a selection circuit,
wherein a signal output from the decoder and a first signal are input to the selection circuit,
wherein second signals are output from the selection circuit to the gate electrodes of the plurality of the transistors for shifting thresholds of the plurality of transistors when the first signal is high, and
wherein the selection circuit performs an OR operation.

10. The semiconductor device according to claim 9, wherein the charge trap layer includes charge trap states.

11. The semiconductor device according to claim 9, wherein the charge trap layer comprises any one of silicon nitride, hafnium oxide, aluminum oxide, and aluminum silicate.

12. The semiconductor device according to claim 9, wherein the electrode is a source electrode or a drain electrode.

13. The semiconductor device according to claim 9, wherein each of the plurality of transistors, further comprises a second semiconductor and a third semiconductor,
wherein the first semiconductor is between the second semiconductor and the third semiconductor, and
wherein the second semiconductor is between the first semiconductor and the charge trap layer.

14. The semiconductor device according to claim 9, wherein a potential applied to the gate electrode is lower than a highest potential that is used in the semiconductor device.

15. A method for manufacturing the semiconductor device according to claim 9,
wherein thresholds of the plurality of transistors are increased by performing heat treatment at a temperature higher than or equal to 125° C. and lower than or equal to 450° C., and at the same time, keeping a potential of the gate electrode higher than a potential of the electrode by the first signal for 1 second or more.

16. The semiconductor device according to claim 9, further comprising:
a third circuit configured to supply the first signal to the selection circuit.

* * * * *